(12) United States Patent
Kawahira et al.

(10) Patent No.: US 11,774,813 B2
(45) Date of Patent: Oct. 3, 2023

(54) LIQUID CRYSTAL DISPLAY DEVICE AND METHOD OF PRODUCING LIQUID CRYSTAL DISPLAY DEVICE

(71) Applicant: Sharp Display Technology Corporation, Kameyama (JP)

(72) Inventors: Yuichi Kawahira, Kameyama (JP); Akira Hirai, Kameyama (JP); Akira Sakai, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/078,404

(22) Filed: Dec. 9, 2022

(65) Prior Publication Data
US 2023/0185139 A1 Jun. 15, 2023

(30) Foreign Application Priority Data

Dec. 10, 2021 (JP) ................................. 2021-200821

(51) Int. Cl.
| | | |
|---|---|---|
| *G02F 1/1335* | (2006.01) | |
| *G02F 1/1362* | (2006.01) | |
| *G02F 1/1368* | (2006.01) | |
| *G02F 1/1333* | (2006.01) | |

(Continued)

(52) U.S. Cl.
CPC .......... *G02F 1/1351* (2021.01); *G02F 1/1368* (2013.01); *G02F 1/133345* (2013.01); *G02F 1/133519* (2021.01); *G02F 1/133553* (2013.01); *G03F 7/039* (2013.01); *G02F 1/136286* (2013.01)

(58) Field of Classification Search
CPC ............. G02F 1/1333; G02F 1/133345; G02F 1/1335; G02F 1/133512; G02F 1/133514; G02F 1/133519; G02F 1/133528; G02F 1/1336; G02F 1/1343; G02F 1/1362; G02F 1/136209; G02F 1/136222; G02F 1/136286; G02F 1/1368; G02F 1/1351; G03F 7/039
See application file for complete search history.

(56) References Cited

U.S. PATENT DOCUMENTS

| | | | | |
|---|---|---|---|---|
| 6,630,274 B1 * | 10/2003 | Kiguchi | ................. | G02B 5/201 |
| | | | | 430/7 |
| 2020/0064683 A1 * | 2/2020 | Hirai | ..................... | G02F 1/1362 |

FOREIGN PATENT DOCUMENTS

| | | |
|---|---|---|
| JP | 2006-163309 A | 6/2006 |
| WO | 2016/080385 A1 | 5/2016 |

* cited by examiner

*Primary Examiner* — Thoi V Duong
(74) *Attorney, Agent, or Firm* — ScienBiziP, P.C.

(57) ABSTRACT

Provided are a liquid crystal display device that can increase light use efficiency and reduce external light reflection, and a method of producing the liquid crystal display device. The liquid crystal display device sequentially includes, from a back surface side toward a viewing surface side: a first substrate; a liquid crystal layer; and a second substrate, the liquid crystal display device including sub-pixels each including an optical opening allowing light to pass through, the first substrate sequentially including, from the back surface side toward the viewing surface side: a supporting substrate; a metal layer surrounding the optical openings; and a resist layer being superimposed with the metal layer and being in contact with the metal layer, an end of the resist layer being superimposed with an end of the metal layer and having a taper angle θ of 40° or more.

10 Claims, 21 Drawing Sheets

(51) Int. Cl.
*G02F 1/135* (2006.01)
*G03F 7/039* (2006.01)

(Back surface side)

(Viewing surface side)

(Back surface side)

LIQUID CRYSTAL DISPLAY DEVICE AND METHOD OF PRODUCING LIQUID CRYSTAL DISPLAY DEVICE

CROSS-REFERENCE TO RELATED APPLICATIONS

The present application claims priority under 35 U.S.C. § 119 to Japanese Patent Application No. 2021-200821 filed on Dec. 10, 2021, the contents of which are incorporated herein by reference in their entirety.

BACKGROUND OF THE INVENTION

Field of the Invention

The following disclosure relates to liquid crystal display devices and methods of producing a liquid crystal display device.

Description of Related Art

Liquid crystal display devices are display devices utilizing a liquid crystal composition to display images. In a typical display mode thereof, a liquid crystal panel containing a liquid crystal composition between a pair of substrates is irradiated with light from a backlight, and voltage is applied to the liquid crystal composition to change the alignment of liquid crystal molecules, whereby the amount of light transmitted through the liquid crystal panel is controlled. Such liquid crystal display devices have a thin profile, light weight, and low power consumption, and are therefore utilized in electronic products such as smartphones, tablet PCs, and automotive navigation systems.

As a technique relating to liquid crystal display devices, for, example, JP 2006-163309 A discloses a method of manufacturing a color filter, the method including: forming a light shielding layer on a transparent substrate using a printing method; forming a positive resist layer thereon; performing development by exposing the positive resist layer to light from the rear side of the transparent substrate; forming an ink repellent agent layer on the positive resist layer, whereby a barrier wall formed by laminating the light shielding layer, the positive resist layer, and the ink repellent agent layer is provided; and delivering ink-jet ink into an aperture surrounded by the barrier wall.

In addition, WO 2016/080385 discloses a liquid crystal display device sequentially including from a back surface side: a backlight unit; a color filter substrate including a color filter and a black matrix; a liquid crystal layer; and a thin-film transistor substrate having thin-film transistor elements, the black matrix including a reflective layer constituting a backlight unit-side surface and a light absorbing layer constituting a thin-film transistor substrate-side surface.

BRIEF SUMMARY OF THE INVENTION

JP 2006-163309 A and WO 2016/080385 do not examine a technique that can increase light use efficiency and reduce external light reflection.

The present invention has been made in view of the art and aims to provide a liquid crystal display device that can increase light use efficiency and reduce external light reflection, and a method of producing the liquid crystal display device.

(1) One embodiment of the present invention is directed to a liquid crystal display device sequentially including, from a back surface side toward a viewing surface side: a first substrate; a liquid crystal layer; and a second substrate,
the liquid crystal display device including sub-pixels each including an optical opening allowing light to pass through,
the first substrate sequentially including, from the back surface side toward the viewing surface side: a supporting substrate; a metal layer surrounding the optical openings; and a resist layer being superimposed with the metal layer and being in contact with the metal layer,
an end of the resist layer being superimposed with an end of the metal layer and having a taper angle θ of 40° or more.
(2) In an embodiment of the present invention, the liquid crystal display device includes the structure (1) and a distance between the end of the resist layer and the end of the metal layer is within 0.1 μm.
(3) In an embodiment of the present invention, the liquid crystal display device includes the structure (1) or (2) and the resist layer is a positive resist layer.
(4) In an embodiment of the present invention, the liquid crystal display device includes the structure (1), (2), or (3) and the resist layer includes at least one of novolac resin or acrylic resin.
(5) In an embodiment of the present invention, the liquid crystal display device includes the structure (1), (2), (3), or (4) and the resist layer is formed from a resist material plastically deforming when heated at 200° C. or higher and having a lower transmittance in the visible wavelength range after the heating than before the heating.
(6) In an embodiment of the present invention, the liquid crystal display device includes the structure (1), (2), (3), (4), or (5) and further includes a backlight on or behind a back surface side of the first substrate.
(7) In an embodiment of the present invention, the liquid crystal display device includes the structure (1), (2), (3), (4), (5), or (6) and the second substrate includes a thin-film transistor and a metal line layer.
(8) In an embodiment of the present invention, the liquid crystal display device includes the structure (7) and the second substrate further includes a reflectance-reducing layer on a viewing surface side of the metal line layer, the reflectance-reducing layer being superimposed with the metal line layer.
(9) In an embodiment of the present invention, the liquid crystal display device includes the structure (1), (2), (3), (4), (5), (6), (7), or (8) and the first substrate further includes a color filter layer.
(10) In an embodiment of the present invention, the liquid crystal display device includes the structure (1), (2), (3), (4), (5), (6), (7), or (8) and the second substrate further includes a color filter layer.
(11) Another embodiment of the present invention is directed to a method of producing a liquid crystal display device sequentially including, from a back surface side toward a viewing surface side: a first substrate; a liquid crystal layer; and a second substrate,
the liquid crystal display device including sub-pixels each including an optical opening allowing light to pass through,
the method including a process of producing the first substrate, the process sequentially including:
applying a resist material to a surface of a metal layer on a supporting substrate;
exposing the resist material to light;
developing the exposed resist material to form a resist layer;
etching the metal layer through the resist layer; and
heating the resist layer.
(12) In an embodiment of the present invention, the method includes the process (11) and in the heating, the resist layer is heated at a temperature equal to or higher than a glass transition temperature of the resist material.
(13) In an embodiment of the present invention, the method includes the process (11) or (12) and the resist material plastically deforms when heated at 200° C. or higher and has a lower transmittance in the visible wavelength range after the heating than before the heating.

The present invention can provide a liquid crystal display device that can increase light use efficiency and reduce external light reflection and a method of producing the liquid crystal display device.

DETAILED DESCRIPTION OF THE INVENTION (Definitions of Terms)

As used herein, the viewing surface side means the side closer to the screen (display surface) of the liquid crystal display device, and the back surface side means the side farther from the screen (display surface) of the liquid crystal display device.

Embodiments of the present invention are described below. The present invention is not limited to the contents described in the following embodiments, but can be appropriately modified in design within the range that satisfies the configuration of the present invention.

Embodiment 1

Figure 1:
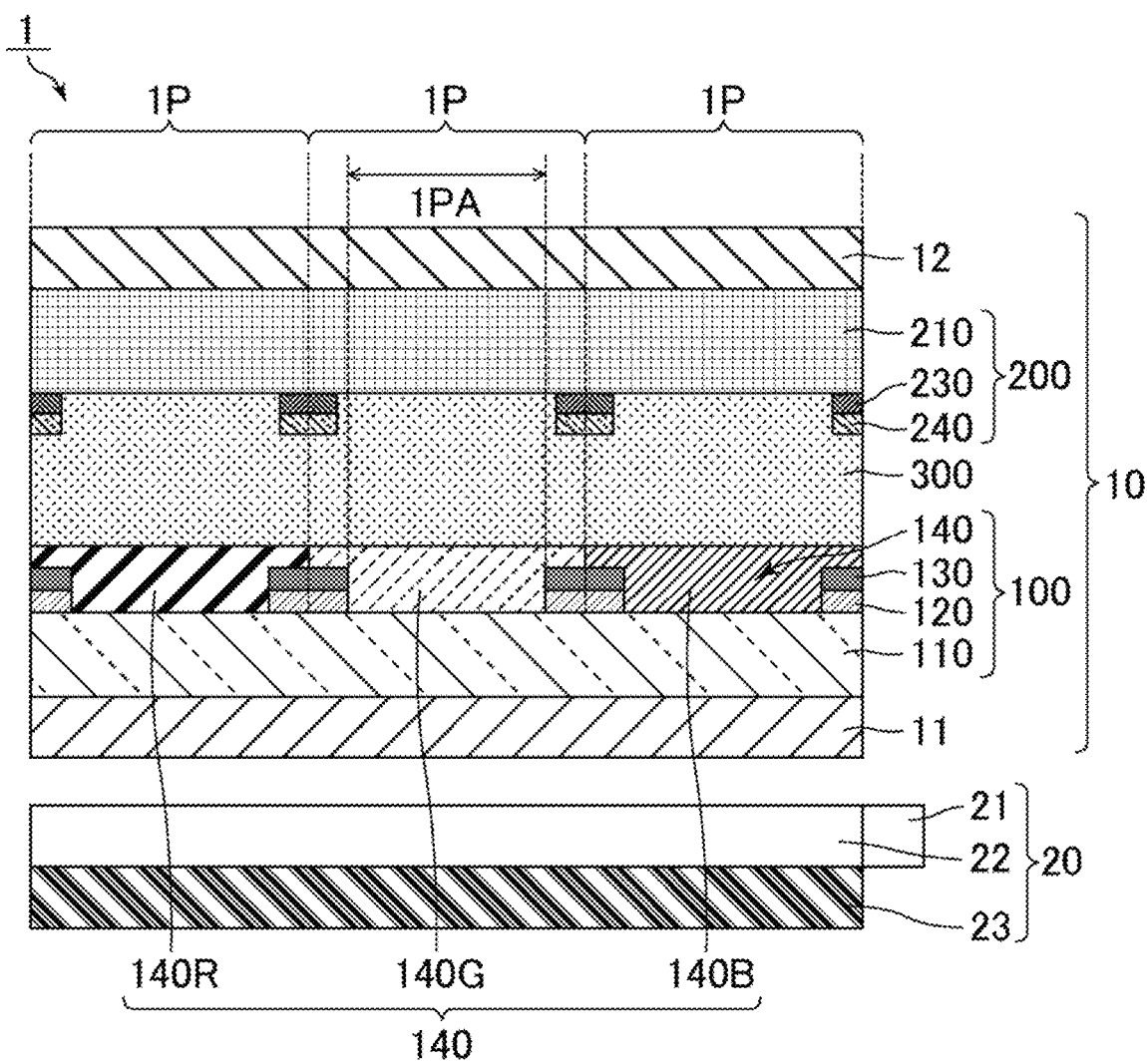
FIG. 1 is a schematic cross-sectional view of a liquid crystal display device of Embodiment 1.
Figure 2:
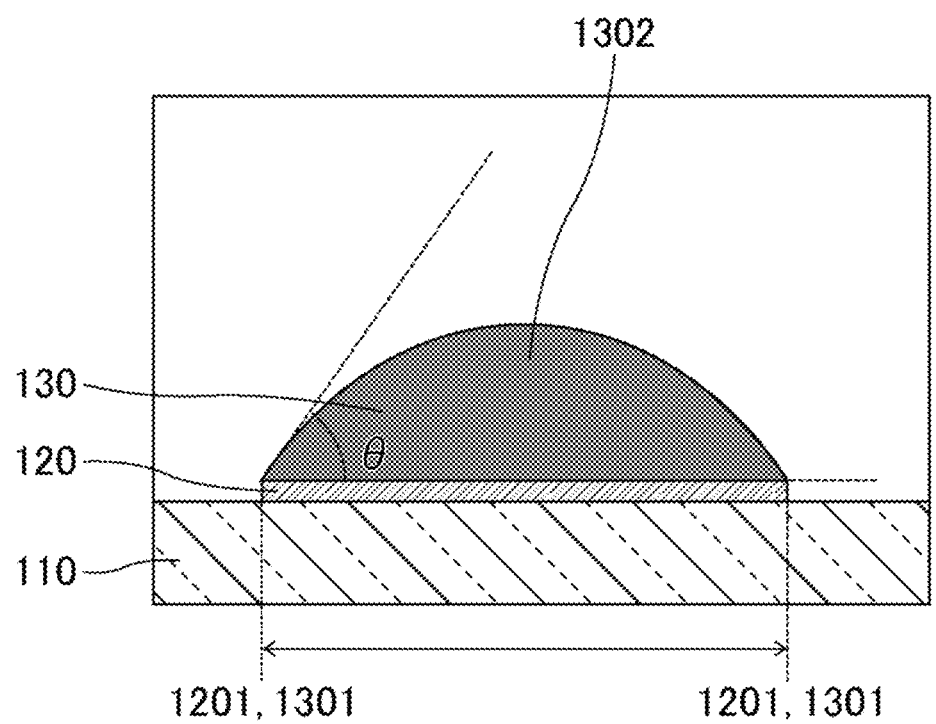
FIG. 2 is an enlarged schematic cross-sectional view of a first substrate in the liquid crystal display device of Embodiment 1.

FIG. 1 is a schematic cross-sectional view of a liquid crystal display device of Embodiment 1. FIG. 2 is an enlarged schematic cross-sectional view of a first substrate in the liquid crystal display device of Embodiment 1. As shown in FIGS. 1 and 2, a liquid crystal display device 1 of the present embodiment sequentially includes, from a back surface side toward a viewing surface side: a first substrate 100; a liquid crystal layer 300; and a second substrate 200, the liquid crystal display device 1 including sub-pixels 1P each including an optical opening 1PA allowing light to pass through, the first substrate 100 sequentially including, from the back surface side toward the viewing surface side: a first supporting substrate 110; a metal layer 120 surrounding the optical openings 1PA; and a resist layer 130 being superimposed with the metal layer 120 and being in contact with the metal layer 120. Such a structure, when a backlight is disposed on or behind the back surface side of the first substrate 100, allows light from the backlight to be efficiently reflected by the metal layer 120, increasing the light use efficiency.

An end 1301 of the resist layer 130 is superimposed with an end 1201 of the metal layer 120 and has a taper angle θ of 40° or more. Such a structure allows the resist layer 130 with a sufficient thickness to be disposed on the surface of the metal layer 120, reducing external light reflection caused by the metal layer 120.

Conventional liquid crystal panels each typically include a TFT substrate having thin-film transistors (TFTs) on the back surface side of the liquid crystal layer. Hereinafter, a conventional liquid crystal panel with a TFT substrate disposed on the back surface side is also referred to as a "liquid crystal panel having a normal structure", and a liquid crystal panel with a TFT substrate disposed on the viewing surface side is also referred to as a "liquid crystal panel having an inverted structure" or a "flip panel".

The present inventors have examined liquid crystal panels and found the following: in the production of the back surface side substrate (first substrate) including the metal layer in a liquid crystal panel (flip panel) having an inverted structure, when a resin black matrix layer, which serves as an acrylic negative resist layer, is disposed on the viewing surface side of a metal layer, a thin film region is formed at an end of the patterned resin black matrix layer, increasing external light reflection in the thin film region and deteriorating the visibility in bright light.

Here, the negative resist layer is a layer formed using a negative resist material. The negative resist material refers to a resist material in which a portion thereof that is exposed to ultraviolet (UV) light becomes insoluble to a developer and is left as a portion forming the pattern. Such a resist material left as a portion forming the resist pattern which is the inverse (negative) of the mask pattern is defined to be "negative". On the other hand, a resist material which becomes soluble in a developer when exposed to UV light and is removable by development refers to a positive resist material. A layer formed using the positive resist material refers to a positive resist layer. Such a resist material left as a portion forming the resist pattern has the same pattern as the mask pattern and is defined to be "positive".

When the resin black matrix layer is formed on the metal layer, exposed to light through a mask, and patterned by development, the resin black matrix layer is likely to be left as residues. This is because the resin black matrix layer has higher adhesion to the metal layer than to the glass substrate. Thus, in the patterning of the resin black matrix layer on the metal layer, a longer development time is required for removing the residues of the resin black matrix layer than in the usual patterning. The longer development time of the resin black matrix layer forms a hollow in an end of the bulk (a portion not a surface layer) of the resin black matrix layer immediately after development. If such a resin black matrix layer is subjected to post-processing involving baking at 200° C. or higher, a thin-film region is formed at the end of the resin black matrix layer. In the thin-film region of the resin black matrix layer, the metal layer is left. This causes a decrease in aperture ratio (a decrease in transmittance) and an increase in panel reflectance (a decrease in visibility in external light).

The present inventors have examined liquid crystal panels and found the following: in the production of the back surface side substrate, the metal layer is patterned using a positive resist layer, which is commonly used for patterning metal layers such as an aluminum layer, instead of the resin black matrix layer, and the positive resist layer is baked at 200° C. or higher without being removed, for example, to be left as a permanent film, whereby coinciding of an end of the patterned metal layer with an end of the patterned positive resist layer is achieved without generating a thin resist film region, which is commonly formed in the patterning of the metal layer using the resin black matrix layer. They also have found that even if the end of the patterned metal layer does not coincide with the end of the patterned positive resist layer (e.g., even if these ends are about 0.5 μm apart) immediately after etching the metal layer, the subsequent high-temperature baking (e.g., baking at 200° C. or higher) promotes gelation of the positive resist layer during the baking, and the surface tension on the metal layer allows the end of the patterned metal layer and the end of the patterned positive resist layer to coincide with each other. These examinations achieve the liquid crystal display device 1 of the present embodiment, in which the end 1301 of the resist layer 130 is superimposed with the end 1201 of the metal layer 120 and has a taper angle θ of 40° or more. The liquid crystal display device 1 having such a structure allows the resist layer 130 with a sufficient thickness to be disposed on the surface of the metal layer 120, reducing external light reflection caused by the metal layer 120.

In the structure in the present embodiment, there is a concern that the replacement of the resin black matrix layer with the positive resist layer may cause a side effect of increasing external light reflection. In a liquid crystal panel having an inverted structure, the TFT substrate is on the viewing surface side, and the patterned metal layer and the patterned positive resist layer are largely superimposed with the metal line layer including components such as source lines and gate lines of the TFT substrate. By subjecting the metal line layer in the TFT substrate to a blackening treatment to be black-colored like a resin black matrix in advance, an increase in external light reflection can be prevented in a portion where the metal line layer is superimposed with the positive resist layer. In addition, even if the patterned metal layer or the patterned positive resist layer protrudes from a region of the metal line layer of the TFT substrate in the design, the positive resist layer can absorb light in the blue to green wavelength region, thus preventing an increase in external light reflection.

JP 2006-163309 A examines neither increasing the light use efficiency nor reducing external light reflection. WO 2016/080385 has a problem that external light reflection increases in the liquid crystal panel and visibility in external light deteriorates.

JP 2006-163309 A also discloses a method of producing a color filter including a positive resist on a light shielding layer. Here, JP 2006-163309 A aims to provide a color filter that can be produced only by printing or inkjet coating without using photolithography. Thus, a light shielding layer is required to be made from a material that can be printed or inkjet coated. Metal layers cannot be formed by printing or inkjet coating, and JP 2006-163309 A does not use a metal layer as a light-shielding layer.

The role of the positive resist in JP 2006-163309 A is not to precisely pattern the light shielding layer, but to prevent the release agent added to the light shielding layer from leaching from the light shielding layer and spreading to other components during printing. From such a viewpoint, the light shielding layer in JP 2006-163309 A is different from the metal layer 120 in the present embodiment. The liquid crystal display device 1 of the present embodiment is described in more detail below.

As shown in FIGS. 1 and 2, the liquid crystal display device 1 includes a liquid crystal panel 10 sequentially including, from the back surface side toward the viewing surface side: a first polarizing plate 11; the first substrate 100; the liquid crystal layer 300; the second substrate 200; and a second polarizing plate 12. The first substrate 100 and the second substrate 200 are attached together with a sealing material surrounding the liquid crystal layer 300, whereby the liquid crystal layer 300 is held between the substrates.

The liquid crystal display device 1 also includes a backlight 20 on or behind the back surface side of the first substrate 100. Such a structure allows light from the backlight 20 to be efficiently reflected by the metal layer 120 in the first substrate 100, increasing the light use efficiency. The backlight 20 includes a light source 21, a light guide plate 22, and a reflector 23.

The first substrate 100 sequentially includes, from the back surface side toward the viewing surface side: a first supporting substrate 110 such as a glass substrate; the metal layer 120; the resist layer 130; and a color filter (CF) layer 140. The first substrate 100 is also referred to as a CF substrate. The second substrate 200 includes TFTs and sequentially includes from the viewing surface side toward the back surface side a second supporting substrate 210 such as a glass substrate, a reflectance-reducing layer 230, and a metal line layer 240. The second substrate 200 is also referred to as a TFT substrate. The liquid crystal panel 10 of the present embodiment is a liquid crystal panel having an inverted structure.

The material of the metal layer 120 may be aluminum, which has a reflectance of 85%, or may be a highly reflective material such as silver, an alloy of aluminum, or an alloy of silver. The metal layer 120 preferably contains at least one of aluminum, silver, an alloy of aluminum, or an alloy of silver.

The metal layer 120 has a reflective surface on the side opposite to the resist layer 130 and can efficiently reflect light incident on the first substrate 100. Specifically, the light from the backlight 20 on or behind the first supporting substrate 110 side of the metal layer 120 is efficiently reflected between the reflecting surface of the metal layer 120 and the reflector 23 of the backlight 20. Thereby, the light use efficiency can be increased.

The reflective surface of the metal layer 120 preferably has a reflectance of 85% or higher. Thereby, the light use efficiency can be further increased. The reflective surface of the metal layer 120 preferably contains at least one of aluminum or silver.

The light use efficiency can be increased by efficient reflection of light between the metal layer 120 and the reflector 23 of the backlight 20. Thus, the higher the reflectance of the metal layer 120 (in particular, the reflective surface of the metal layer 120), the better, and the higher the reflectance of the reflector 23 of the backlight 20, the better.

The resist layer 130 is preferably a positive resist layer. Such a resist layer 130 can have a larger taper angle θ, effectively reducing external light reflection caused by the metal layer 120.

The resist layer 130 can be formed by applying a resist material using an application means such as a bar coater, roll coater, spin coater, die coater, or gravure coater. The resist layer 130 may have a thickness of 0.5 μm to 5.0 μm, for example.

The resist layer 130 preferably contains at least one of novolac resin or acrylic resin. Such a resist layer 130 can have a larger taper angle θ, effectively reducing external light reflection caused by the metal layer 120.

Preferably, the resist layer 130 is formed from a resist material plastically deforming when heated at 200° C. or higher and having a lower transmittance in the visible wavelength range after the heating than before the heating. Such a resist layer 130 can absorb light in the visible light wavelength range, further reducing external light reflection.

The pattern of the resist layer 130 is preferably the same as the pattern of the metal layer 120 in plan view. Such a structure can reduce external light reflection at the metal layer 120 without decreasing the aperture ratio.

The distance between the end 1201 of the metal layer 120 and the end 1301 of the resist layer 130 is preferably within 0.1 μm. Such a structure allows the end of the patterned metal layer 120 and the end of the patterned resist layer 130 to further closely coincide with each other and can reduce external light reflection at the metal layer 120 without decreasing the aperture ratio.

The end 1301 of the resist layer 130 has a taper angle θ of 40° or more. Such a structure allows the resist layer 130 with a sufficient thickness to be disposed on the viewing surface side of the metal layer 120, reducing external light reflection caused by the metal layer 120. Here, the taper angle θ of the end 1301 of the resist layer 130 refers to an angle between the main surface of the metal layer 120 and the tangent line of the end 1301 of the resist layer 130 in cross-sectional view. The upper limit of the taper angle θ is, for example, less than 90°, but is not limited thereto.

The color filters of the CF layer 140 may have any color. For example, the CF layer 140 includes red (R) color filters 140R, green (G) color filters 140G, and blue (B) color filters 140B.

The second substrate 200 includes pixel electrodes disposed on the liquid crystal layer 300 side surface of the second supporting substrate 210 and having a planar shape occupying the respective pixel regions; an insulating film covering the pixel electrodes; and a common electrode disposed on the liquid crystal layer 300 side surface of the insulating film and provided with slits. In other words, the liquid crystal panel 10 is a fringe field switching (FFS) mode liquid crystal display panel. The arrangement of the pixel electrodes and the common electrodes is not limited to this arrangement. The position of the pixel electrodes may be switched with the position of the common electrodes. In this case, the second substrate 200 includes a common electrode having a planar shape disposed on the liquid crystal layer 300 side surface of the second supporting substrate 210; an insulating film covering the common electrode; and pixel electrodes disposed on the liquid crystal layer side surface of the insulating film, occupying the respective pixel regions, and provided with slits.

The display mode of the liquid crystal panel 10 is not limited to the FFS mode. The display mode of the liquid crystal panel 10 may be the in-plane switching (IPS) mode, which is a transverse electric field mode like the FFS mode. In this case, the pixel electrodes and the common electrodes in the second substrate 200 are each a comb electrode. Each pixel electrode, which is a comb electrode, and each common electrode, which is a comb electrode, are engaged with each other and are disposed in the same electrode layer. The display mode of the liquid crystal panel 10 may be a vertical electric field mode such as a vertical alignment (VA) mode or a twisted nematic (TN) mode. In this case, the pixel electrodes are disposed in the second substrate 200 and the common electrodes are disposed in the first substrate 100.

Figure 3:
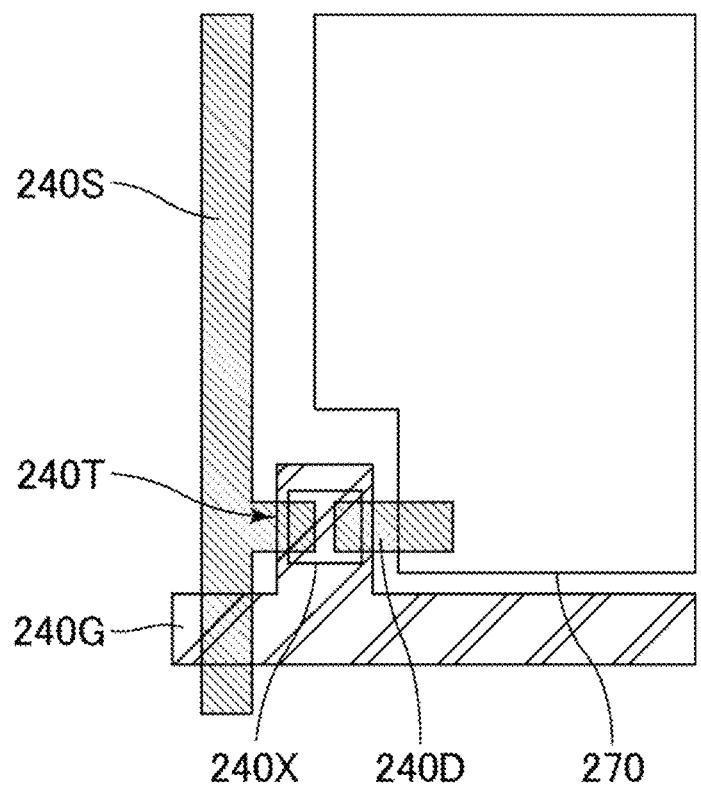
FIG. 3 is an enlarged schematic plan view showing a pixel configuration of a second substrate in the liquid crystal display device of Embodiment 1.

FIG. 3 is an enlarged schematic plan view showing a pixel configuration of a second substrate in the liquid crystal display device of Embodiment 1. The brightness of each pixel in the liquid crystal display device 1 is controlled by controlling the voltage applied to a corresponding pixel electrode 270. The pixel electrode 270 is electrically connected to a drain electrode layer 240D, and the drain electrode layer 240D is connected through a semiconductor layer (channel) 240X to a source electrode layer 240S including source lines. The current flowing into the semiconductor layer 240X is controlled by the voltage applied to a gate electrode layer 240G including gate lines. The gate electrode layer 240G, the source electrode layer 240S, and the drain electrode layer 240D are included in the metal line layer 240 shown in FIG. 1. The source electrode layer 240S and the drain electrode layer 240D are also collectively referred to as "source-drain electrode layers". The liquid crystal display device 1 of the present embodiment includes pixel regions (optical openings) and non-display regions each between adjacent pixel regions in plan view. Each pixel region is provided with the corresponding pixel electrode 270, and each non-display region between adjacent pixel regions is provided with the corresponding gate electrode layer 240G, source electrode layer 240S, drain electrode layer 240D, and semiconductor layer 240X.

TFTs 240T are each connected to the corresponding gate line and the corresponding source line, and are each a three-terminal switch including a gate electrode (constituting a part of the gate line) protruding from the gate line, a source electrode (constituting a part of the source line) protruding from the source line, a drain electrode connected to the pixel electrode 270, and the semiconductor layer 240X.

The semiconductor layer 240X is preferably made from an oxide semiconductor. Examples of the oxide semiconductor include a compound (In—Ga—Zn—O) including indium (In), gallium (Ga), zinc (Zn), and oxygen (O), a compound (In—Sn—Zn—O) including indium (In), Tin (Sn), zinc (Zn), and oxygen (O), and a compound (In—Al—Zn—O) including indium (In), aluminum (Al), zinc (Zn), and oxygen (O). Preferred among these is a compound (In—Ga—Zn—O, IGZO) including indium, gallium, zinc, and oxygen.

The pixel electrode 270 and each common electrode may be transparent electrodes and can be formed from a transparent conductive material such as indium tin oxide (ITO), indium zinc oxide (IZO), zinc oxide (ZnO), or tin oxide (SnO), or an alloy of any of these, for example.

Figure 4:
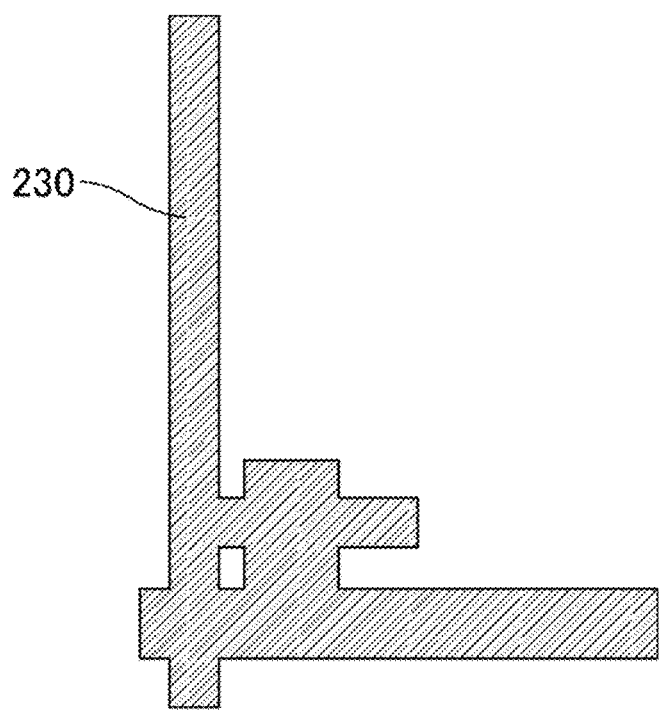
FIG. 4 is a schematic plan view showing a reflectance-reducing layer configuration in the liquid crystal display device of Embodiment 1.

FIG. 4 is a schematic plan view showing a configuration of a reflectance-reducing layer in the liquid crystal display device of Embodiment 1. As shown in FIGS. 2 to 4, the second substrate 200 includes the reflectance-reducing layer 230 disposed on the viewing surface side of the metal line layer 240 and superimposed with the metal line layer 240. Such a structure can reduce external light reflection caused by the metal line layer 240. The reflectance-reducing layer 230 is disposed in the positions corresponding to the gate electrode layer 240G, the source electrode layer 240S, and the drain electrode layer 240D. The reflectance-reducing layer 230 can reduce the reflection of external light incident on the gate electrode layer 240G, the source electrode layer 240S, and the drain electrode layer 240D. The reflectance-reducing layer 230 may or may not be in contact with the metal line layer 240.

The reflectance-reducing layer 230 has a lower viewing surface side reflectance than the metal line layer 240. The reflectance of each of the reflectance-reducing layer 230 and the metal line layer 240 can be measured by, for example, forming a layer to be measured on a glass substrate, allowing light to be incident on the target layer from the glass substrate side with a D65 light source, and measuring the reflectance of the layer with CM-2600d available from Konica Minolta, Inc. The measurement wavelength ranges from 380 nm to 780 nm which corresponds to a visible light region, and the measurement is performed without components such as a polarizing plate.

The reflectance-reducing layer 230 has a lower viewing surface side reflectance than the metal line layer 240 by preferably 5% or more, more preferably by 10% or more, still more preferably by 20% or more. Such a structure can further reduce external light reflection caused by the metal line layer 240.

The reflectance-reducing layer 230 has a viewing surface side reflectance of 3% or more and 30% or less, for example.

The metal line layer 240 has a viewing surface side reflectance of 35% or more and 85% or less, for example.

The reflectance-reducing layer 230 has a transmittance of preferably 95% or less, more preferably 50% or less, still more preferably 10% or less. Such a reflectance-reducing layer 230 can further reduce the reflection on the viewing surface side of the reflectance-reducing layer 230, whereby external light reflection can be effectively reduced. The transmittance of the reflectance-reducing layer 230 can be measured by, for example, forming a reflectance-reducing layer to be measured on a glass substrate and measuring the transmittance of the layer with V7100 available from Jasco Corporation using a D65 light source. The measurement wavelength ranges from 380 nm to 780 nm which corresponds to a visible light region, and the measurement is performed without components such as a polarizing plate.

The reflectance-reducing layer 230 includes at least one of an organic film or an inorganic film. The organic film and the inorganic film may each be a single-layer film or a multi-layer film. The organic film in the reflectance-reducing layer 230 preferably contains carbon black. Such a reflectance-reducing layer 230 can further reduce external light reflection. The organic film may be made of a carbon black-containing resin, for example. The organic film in the reflectance-reducing layer 230 is also preferably a retardation film. Such a reflectance-reducing layer 230 can convert the external light that has been polarized by the second polarizing plate 12 to circularly polarized light, further reducing external light reflection.

The metal line layer 240 includes the terminals (gate, source, and drain) of the TFTs 240T disposed in the second substrate 200 and lines electrically connected to the terminals. The metal line layer 240 is constituted by a metal material (metal or alloy).

As shown in FIG. 1, the metal layer 120 is superimposed with the reflectance-reducing layer 230 and the metal line layer 240. In such a structure, the reflectance-reducing layer 230 can reduce external light reflection caused by both the metal layer 120 and the metal line layer 240.

The liquid crystal layer 300 contains liquid crystals. The surfaces sandwiching the liquid crystal layer 300 are provided with alignment films (not shown) that control the alignment of the liquid crystals. As for the display mode, the present embodiment is described with reference to a FFS-mode liquid crystal display device as an example, but the display mode is not limited. The present embodiment can also be applied to a transverse electric field liquid crystal display device, such as an IPS-mode liquid crystal display device, and a vertical electric field liquid crystal display device, such as a VA mode or TN mode liquid crystal display device. In a transverse electric field liquid crystal display device, when no voltage is applied between the pair of electrodes (with no voltage applied) in the TFT substrate, the liquid crystals in the liquid crystal layer 300 are horizontally aligned by the control force of the horizontal alignment films. In contrast, when voltage is applied between the pair of electrodes (with voltage applied), the liquid crystals rotate in an in-plane direction in response to the transverse electric fields generated in the liquid crystal layer 300.

As shown in FIG. 1, the liquid crystal panel 10 includes the backlight 20 on or behind the back surface side thereof. Light from the backlight 20 is incident on the liquid crystal panel 10 and the amount of light transmitted by the liquid crystal panel 10 is controlled by the voltage applied to the liquid crystal layer 300 in the liquid crystal panel 10. Although FIG. 1 illustrates an edge-lit backlight including the light source 21, the light guide plate 22, and the reflector 23, the backlight 20 of the present embodiment may be of any type and may be a direct-lit backlight. The light source 21 of the backlight may be of any type such as light emitting diodes (LEDs) or cold cathode fluorescent lamps (CCFLs). The reflector 23 is disposed on the back surface side of the light guide plate 22 and faces the first substrate 100. The reflector 23 may be formed of any material that can reflect light incident from the light guide plate 22 side. From the standpoint of a sufficient increase in the light recycling effect, the reflector 23 preferably has a reflectance of 50% or higher.

The first polarizing plate 11 and the second polarizing plate 12 are preferably absorptive polarizing plates obtained by aligning an anisotropic material such as a dichroic iodine complex adsorbed onto a polyvinyl alcohol (PVA) film. Typically, each surface of the PVA film is laminated with a protective film such as a triacetyl cellulose film for practical use. An optical film such as a retardation film may be disposed between the first polarizing plate 11 and the first supporting substrate 110 and between the second supporting substrate 210 and the second polarizing plate 12.

The polarization axis of the first polarizing plate 11 and the polarization axis of the second polarizing plate 12 may be orthogonal to each other. Each polarization axis may be the absorption axis of the polarizing plate or the transmission axis of the polarizing plate.

The following describes the method of producing the liquid crystal display device 1 of the present embodiment. The method of producing the liquid crystal display device 1 of the present embodiment 1 is a method of producing the liquid crystal display device 1 sequentially including, from a back surface side toward a viewing surface side: the first substrate 100; the liquid crystal layer 300; and the second substrate 200, the liquid crystal display device 1 including the sub-pixels 1P each including the optical opening 1PA allowing light to pass through, the method including a process of producing the first substrate 100, the process sequentially including: applying a resist material to a surface of the metal layer 120 on a supporting substrate (the first supporting substrate 110); exposing the resist material to light; developing the exposed resist material to form the resist layer 130; etching the metal layer 120 through the resist layer 130; and heating the resist layer 130.

The supporting substrate (the first supporting substrate 110) provided with the metal layer 120 is obtained, for example, by vapor-depositing metal such as aluminum on the first supporting substrate 110.

The applying is a process of applying a resist material to the surface of the metal layer 120 of the supporting substrate (the first supporting substrate 110) provided with the metal layer 120. In the applying, the resist material is applied to the metal layer 120 using an application means such as a bar coater, roll coater, spin coater, die coater, or gravure coater, and is pre-baked, for example. Thereby, the resist layer 130 is formed. The resist material is preferably a positive resist material. The resist layer 130 may be dried under reduced pressure before the pre-baking in the applying.

The exposing is a process of exposing the resist material to light. The light applied to the resist material may be a mixture of g-line, h-line, and i-line, for example. The irradiation amount is, for example, 20 mJ/cm$^2$ to 200 mJ/cm$^2$.

The developing is a process of developing the exposed resist material to form the resist layer 130. The developing uses a developing solution. The developing solution may be an alkaline solution. The developing leaves the resist layer 130 only in the regions where no light has been applied in the exposing.

The etching is a process of etching the metal layer 120 through the resist layer 130. The etching uses an etchant. An example of the etchant is an acid mixture containing phosphoric acid, acetic acid, and nitric acid. The etching time is, for example, 50 to 150 seconds. In the etching, the metal layer 120 is etched only in the regions where no resist layer 130 is disposed, whereby the metal layer 120 having almost the same pattern as the resist layer 130 can be formed.

The heating is a process of heating the resist layer 130. The heating can stabilize the resist layer 130 as a permanent film. In the heating, the resist layer 130 is preferably heated at a temperature equal to or higher than the glass transition temperature of the resist material. In such a structure, gelation of the resist layer 130 is promoted, the surface tension on the metal layer 120 allows the end of the patterned metal layer 120 and the end of the patterned resist layer 130 to coincide with each other, and the resist layer 130 with a sufficient thickness can be disposed on the viewing surface side of the metal layer 120. As a result, external light reflection caused by the metal layer 120 can be further reduced.

The process of producing the first substrate 100 may further include a CF layer-forming step including forming the CF layer 140 on the resist layer 130 after the heating. The CF layer-forming step can be performed in the same way as the general CF layer-forming step. For example, a photolithography method may be used to form the CF layer 140.

(Modified Example of Embodiment 1)

In the present embodiment, features unique to the present embodiment are mainly described, and descriptions for the points similar to Embodiment 1 are omitted. In Embodiment 1, the CF layer 140 is disposed in the first substrate 100. In the present embodiment, the CF layer 140 may be disposed in the second substrate 200.

Figure 5:
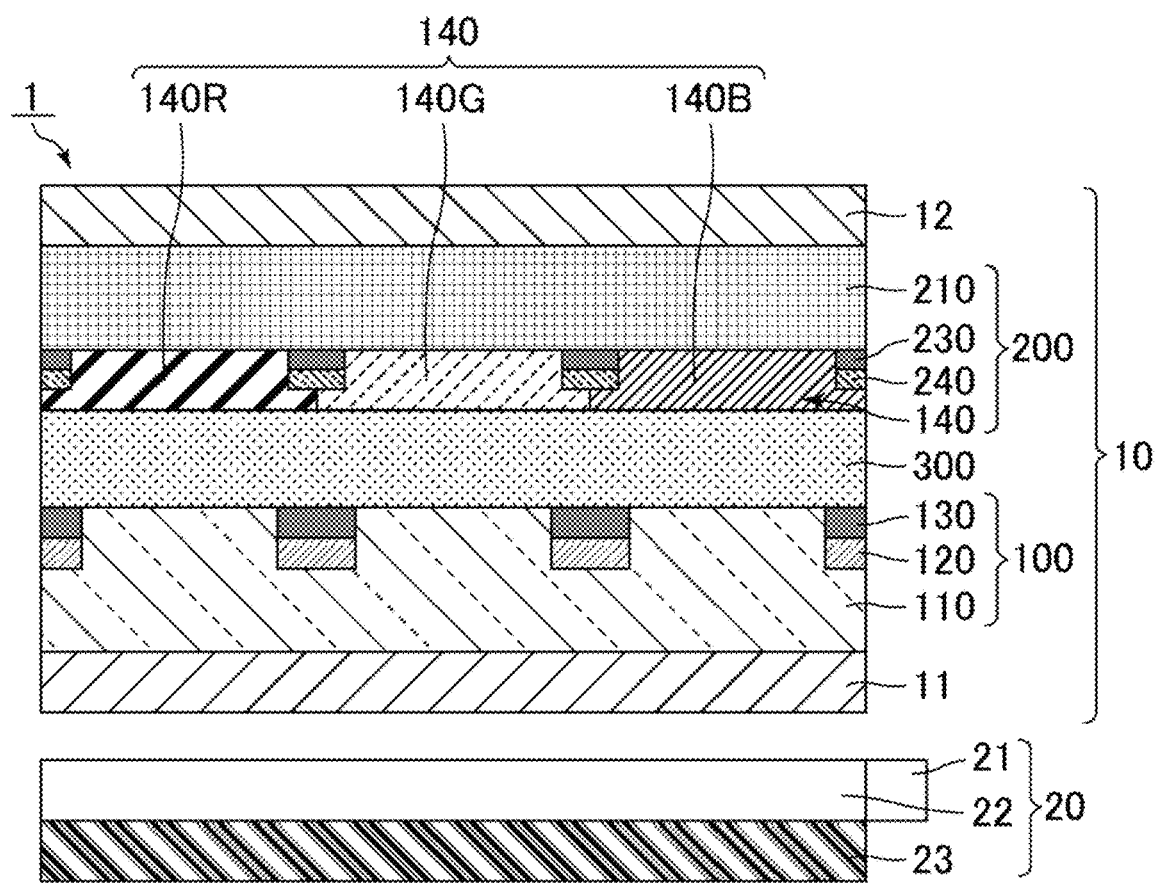
FIG. 5 is a schematic cross-sectional view of a liquid crystal display device of a modified example of Embodiment 1.

FIG. 5 is a schematic cross-sectional view of a liquid crystal display device of a modified example of Embodiment 1. As shown in FIG. 5, the second substrate 200 in the liquid crystal display device 1 of the modified example includes the CF layer 140. In such a structure, the CF layer 140 in the second substrate 200 absorbs light, whereby the phenomenon is prevented that the external light is diffracted by electrodes (common electrodes) provided with slits and looks like rainbow colors on the panel.

The present invention is described in more detail below based on examples and comparative examples. The examples, however, are not intended to limit the scope of the present invention.

Production of Liquid Crystal Display Device of Comparative Example 1

Figure 6:
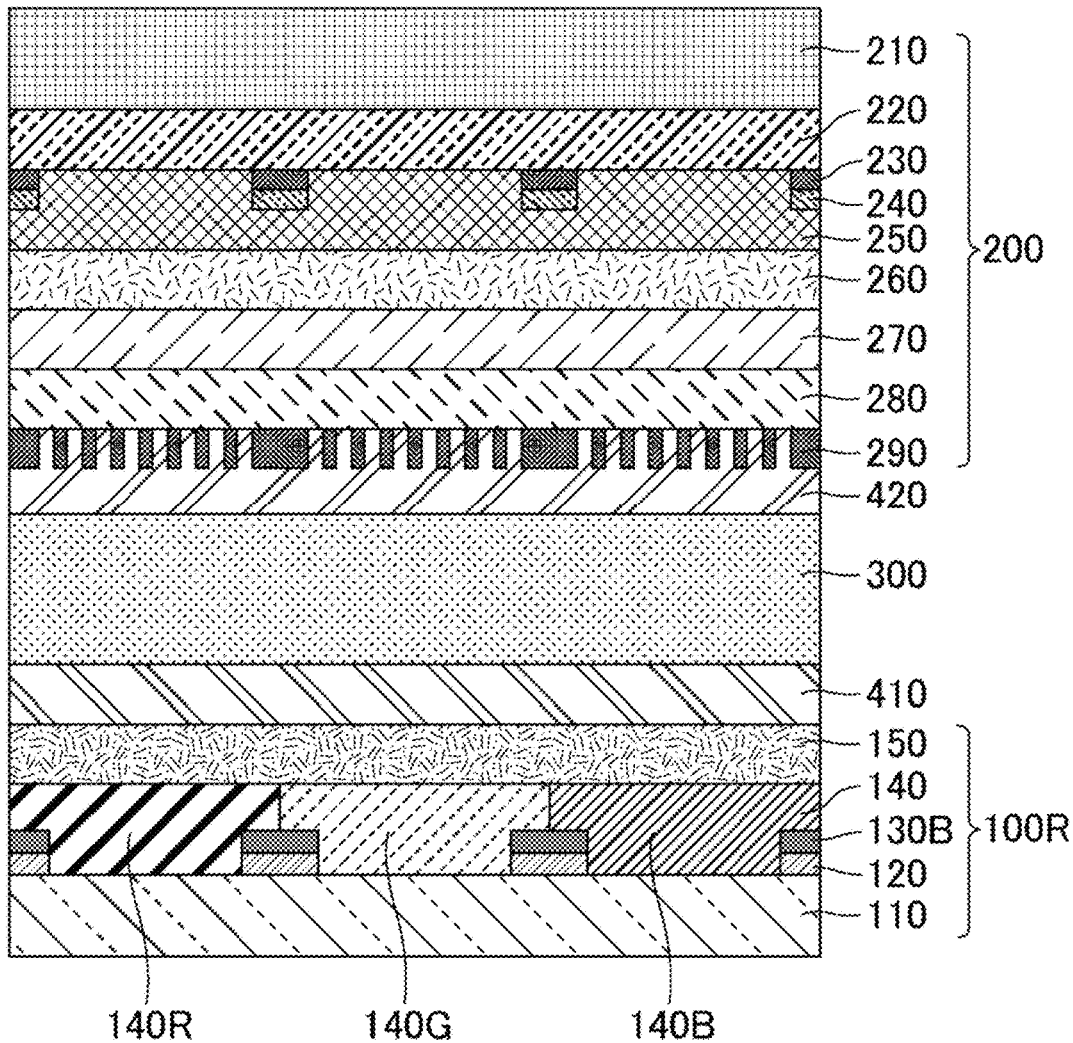
FIG. 6 is a schematic cross-sectional view of a liquid crystal display device of Comparative Example 1.

FIG. 6 is a schematic cross-sectional view of a liquid crystal display device of Comparative Example 1. A liquid crystal display device 1R of Comparative Example 1 shown in FIG. 6 is a liquid crystal display device having an inverted structure. A first substrate 100R in the liquid crystal display device 1R of Comparative Example 1 was produced by patterning an aluminum layer as the metal layer 120 using a resin black matrix (BM) layer 130B. The liquid crystal display device 1R of Comparative Example 1 was specifically produced as follows.

Figure 7A:
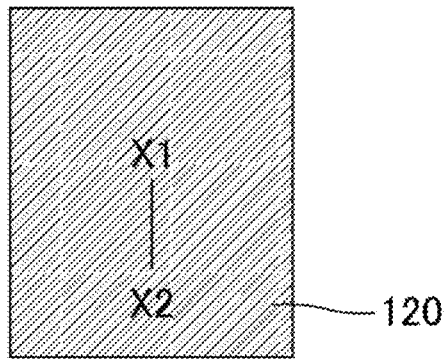
FIG. 7A is a schematic plan view showing a first step in a process of producing the liquid crystal display device of Comparative Example 1.
Figure 7B:
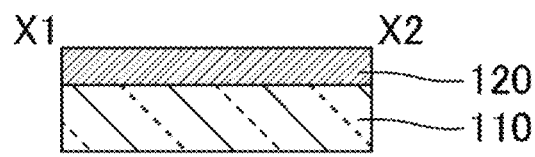
FIG. 7B is a schematic cross-sectional view showing the first step in the process of producing the liquid crystal display device of Comparative Example 1.

First, the first substrate 100R in the liquid crystal display device 1R of Comparative Example 1 was produced as follows. FIG. 7A is a schematic plan view showing a first step in the process of producing the liquid crystal display device of Comparative Example 1. FIG. 7B is a schematic cross-sectional view showing the first step in the process of producing the liquid crystal display device of Comparative Example 1. FIG. 7B is a schematic cross-sectional view taken along line X1-X2 in FIG. 7A. First, in the first step, as shown in FIGS. 7A and 7B, aluminum was vapor-deposited to a thickness of 50 nm on the entire surface of a glass substrate as the first supporting substrate 110, whereby an aluminum layer was formed as the metal layer 120.

Figure 8A:
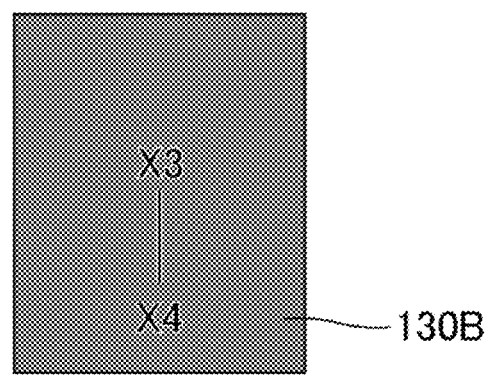
FIG. 8A is a schematic plan view showing a second step in the process of producing the liquid crystal display device of Comparative Example 1.
Figure 8B:
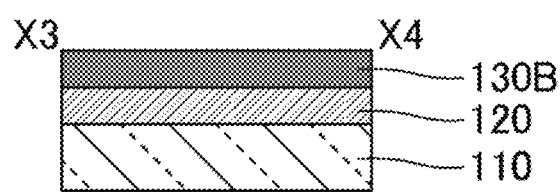
FIG. 8B is a schematic cross-sectional view showing the second step in the process of producing the liquid crystal display device of Comparative Example 1.

FIG. 8A is a schematic plan view showing a second step in the process of producing the liquid crystal display device of Comparative Example 1. FIG. 8B is a schematic cross-sectional view showing the second step in the process of producing the liquid crystal display device of Comparative Example 1. FIG. 8B is a schematic cross-sectional view taken along line X3-X4 in FIG. 8A. Next, in the second step, as shown in FIGS. 8A and 8B, an acrylic negative resist material was applied to the metal layer 120 with a slit coater so as to have a dry film thickness of 1.2 µm after pre-baking. After the application, the acrylic negative resist material was pre-baked (the solvent was dried) at 70° C. for 90 seconds, whereby the resin black matrix layer 130B was formed.

Figure 9A:
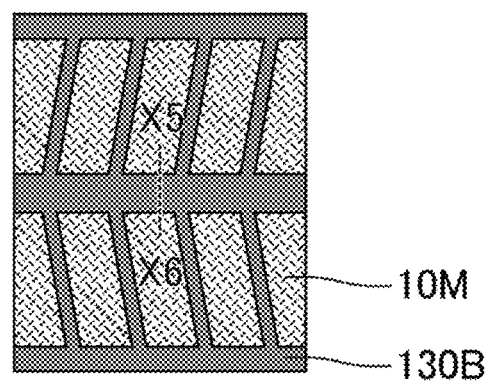
FIG. 9A is a schematic plan view showing a third step in the process of producing the liquid crystal display device of Comparative Example 1.
Figure 9B:
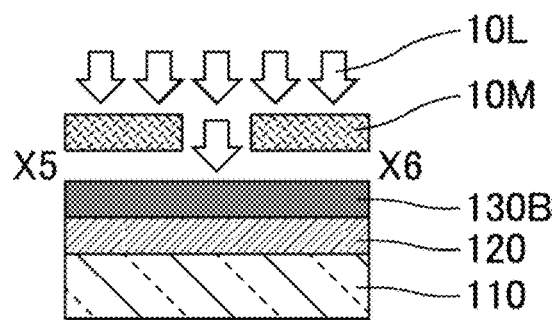
FIG. 9B is a schematic cross-sectional view showing the third step in the process of producing the liquid crystal display device of Comparative Example 1.

FIG. 9A is a schematic plan view showing a third step in the process of producing the liquid crystal display device of Comparative Example 1. FIG. 9B is a schematic cross-sectional view showing the third step in the process of producing the liquid crystal display device of Comparative Example 1. FIG. 9B is a schematic cross-sectional view taken along line X5-X6 in FIG. 9A. Next, in the third step, as shown in FIGS. 9A and 9B, the resin black matrix layer 130B was exposed to UV light 10L through a photomask 10M disposed in a predetermined pattern. The UV light 10L was a mixture of g-line, h-line, and i-line, and the irradiation amount was 50 mJ/cm$^2$.

Figure 10A:
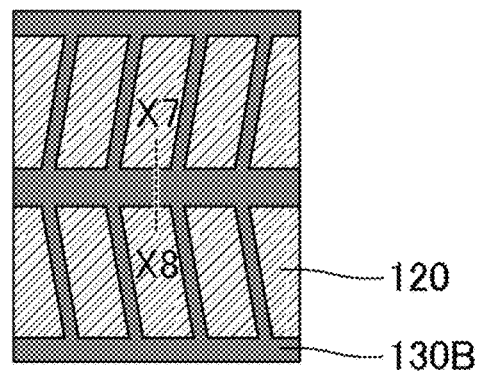
FIG. 10A is a schematic plan view showing a fourth step in the process of producing the liquid crystal display device of Comparative Example 1.
Figure 10B:
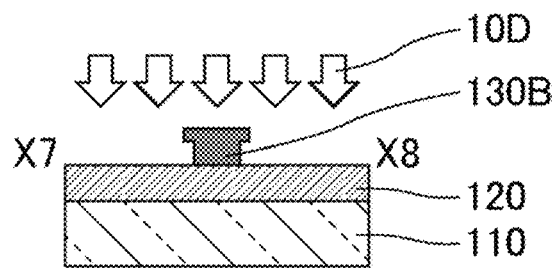
FIG. 10B is a schematic cross-sectional view showing the fourth step in the process of producing the liquid crystal display device of Comparative Example 1.

FIG. 10A is a schematic plan view showing a fourth step in the process of producing the liquid crystal display device of Comparative Example 1. FIG. 10B is a schematic cross-sectional view showing the fourth step in the process of producing the liquid crystal display device of Comparative Example 1. FIG. 10B is a schematic cross-sectional view taken along line X7-X8 in FIG. 10A. Next, in the fourth step, as shown in FIGS. 10A and 10B, the resin black matrix layer 130B was developed using a developer 10D. The developing time was 120 seconds. The developer 10D was an alkaline aqueous solution (0.045% by weight aqueous potassium hydroxide solution). The aqueous potassium hydroxide solution which adhered to the substrate during the development was rinsed with pure water. The fourth step left the resin black matrix layer 130B only in the regions where UV light had been applied.

Figure 11A:
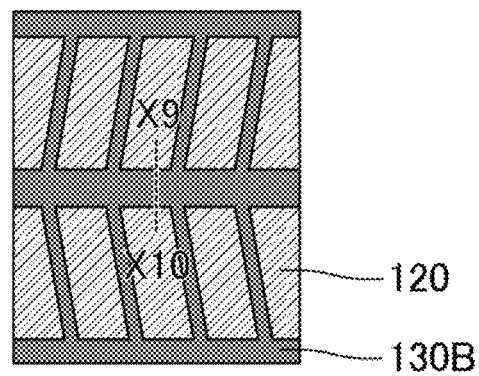
FIG. 11A is a schematic plan view showing a fifth step in the process of producing the liquid crystal display device of Comparative Example 1.
Figure 11B:
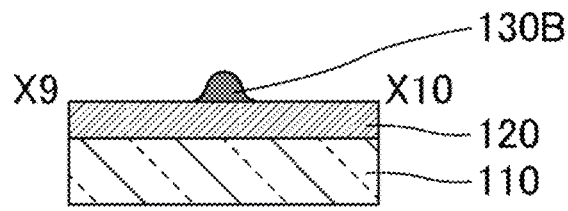
FIG. 11B is a schematic cross-sectional view showing the fifth step in the process of producing the liquid crystal display device of Comparative Example 1.

FIG. 11A is a schematic plan view showing a fifth step in the process of producing the liquid crystal display device of Comparative Example 1. FIG. 11B is a schematic cross-sectional view showing the fifth step in the process of producing the liquid crystal display device of Comparative Example 1. FIG. 11B is a schematic cross-sectional view taken along line X9-X10 in FIG. 11A. Next, in the fifth step, as shown in FIGS. 11A and 11B, the patterned resin black matrix layer 130B was baked at 230° C. for 30 minutes, whereby the patterned resin black matrix layer 130B was thermally cured and firmly adhered to the metal layer 120.

Figure 12A:
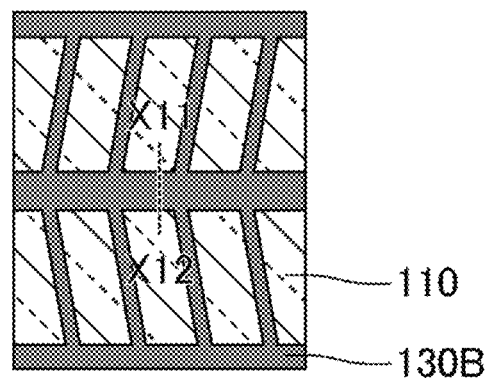
FIG. 12A is a schematic plan view showing a sixth step in the process of producing the liquid crystal display device of Comparative Example 1.
Figure 12B:
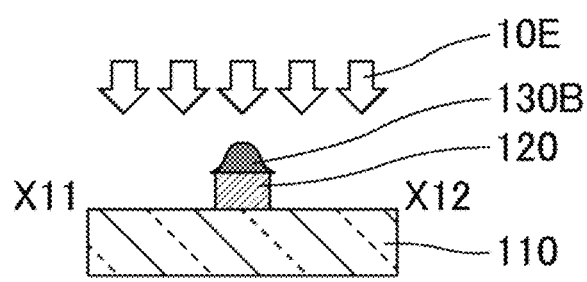
FIG. 12B is a schematic cross-sectional view showing the sixth step in the process of producing the liquid crystal display device of Comparative Example 1.

FIG. 12A is a schematic plan view showing a sixth step in the process of producing the liquid crystal display device of Comparative Example 1. FIG. 12B is a schematic cross-sectional view showing the sixth step in the process of producing the liquid crystal display device of Comparative Example 1. FIG. 12B is a schematic cross-sectional view taken along line X11-X12 in FIG. 12A. Next, in the sixth step, as shown in FIGS. 12A and 12B, the metal layer 120 was etched for 80 seconds using an etchant 10E. The etchant 10E was an acid mixture containing phosphoric acid, acetic acid, and nitric acid. The acid mixture which adhered to the substrate during the etching was rinsed with pure water. In the sixth step, the metal layer 120 was etched only in the regions where no resin black matrix layer 130B was disposed, whereby the metal layer 120 having almost the same pattern as the resin black matrix layer 130B was formed.

Figure 13A:
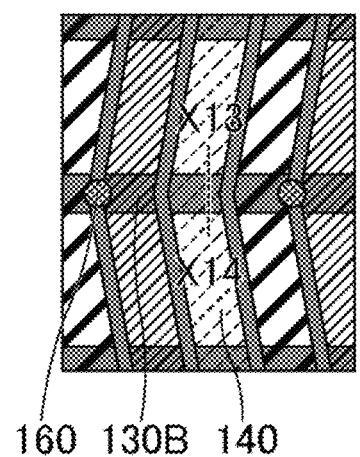
FIG. 13A is a schematic plan view showing a seventh step in the process of producing the liquid crystal display device of Comparative Example 1.
Figure 13B:
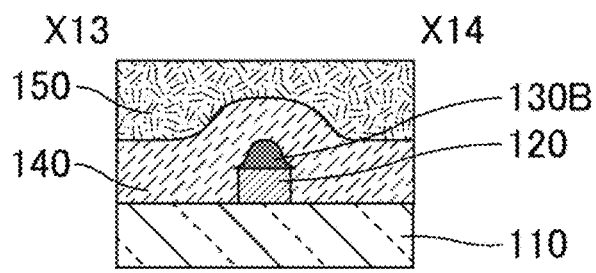
FIG. 13B is a schematic cross-sectional view showing the seventh step in the process of producing the liquid crystal display device of Comparative Example 1.

FIG. 13A is a schematic plan view showing a seventh step in the process of producing the liquid crystal display device of Comparative Example 1. FIG. 13B is a schematic cross-sectional view showing the seventh step in the process of producing the liquid crystal display device of Comparative Example 1. FIG. 13B is a schematic cross-sectional view taken along line X13-X14 in FIG. 13A. Next, in the seventh step, as shown in FIGS. 13A and 13B, the CF layer 140, an overcoat layer 150, and photospacers 160 were formed by photolithography as in the usual process of producing color filters. Thus, the first substrate 100R in the liquid crystal display device 1R of Comparative Example 1 having an inverted structure was produced. The width of the metal layer 120 was the same as the width of the resin black matrix layer 130B, and the metal layer 120 was superimposed with the resin black matrix layer 130B.

Next, the second substrate 200 in the liquid crystal display device 1R of Comparative Example 1 was produced by the usual process. The liquid crystal driving mode of the liquid crystal display device 1R was the FFS mode, the second supporting substrate 210 was a glass substrate, the gate insulating film 220 was an inorganic insulating film made of $SiO_2$, the reflectance-reducing layer 230 was a black resist, the source electrode layer 240S as the metal line layer 240 was a copper alloy film, a first interlayer insulating film 250 was an inorganic insulating film made of $SiO_2$, an organic flattening film 260 was a resin film made of acrylic resin (OPTMER series available from JSR Corporation), the pixel electrode 270 and a common electrode 290 were ITO films, and a second interlayer insulating film 280 was an inorganic insulating film made of SiNx.

An alignment film material was applied to the surface of the first substrate 100R on a side opposite to the glass substrate and the surface of the second substrate 200 on a side opposite to the glass substrate, produced as described above, whereby a first alignment film 410 and a second alignment film 420 were formed, respectively.

Furthermore, a sealing material was applied to the second substrate 200, the liquid crystal layer 300 was formed in the region surrounded by the sealing material, and the first substrate 100R and the second substrate 200 were attached to each other with the sealing material, whereby the liquid crystal display device 1R of Comparative Example 1 was produced. The liquid crystal layer 300 contained negative liquid crystals and had a Δn of 0.1 and a cell gap of 3.2 µm.

Evaluation of Liquid Crystal Display Device of Comparative Example 1

Figure 14:
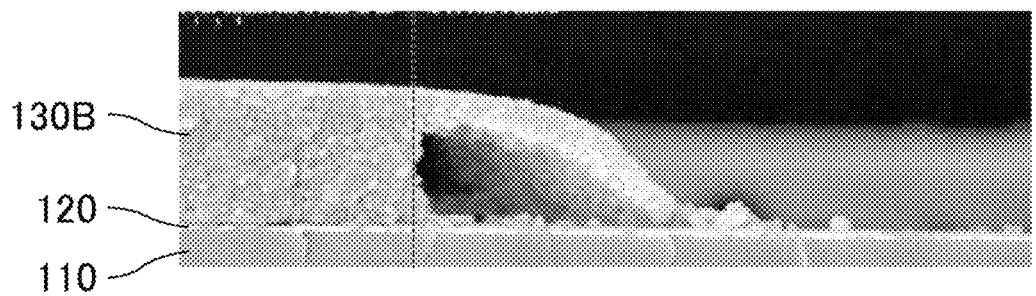
FIG. 14 is an SEM photograph showing an exemplary cross-section of a first substrate after the fourth step in the process of producing the liquid crystal display device of Comparative Example 1.
Figure 15:
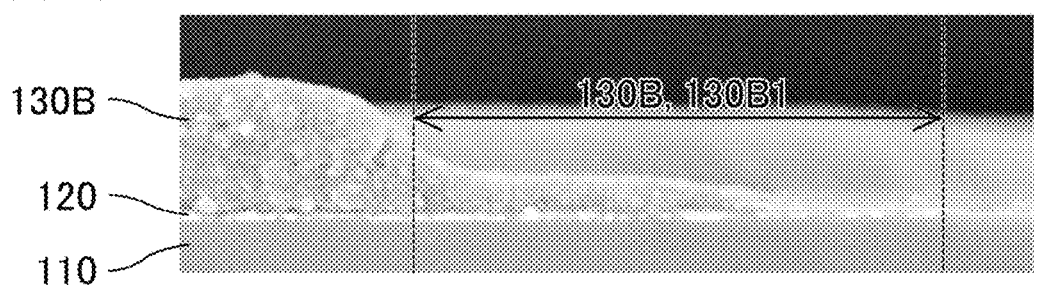
FIG. 15 is an SEM photograph showing an exemplary cross-section of the first substrate after the fifth step in the process of producing the liquid crystal display device of Comparative Example 1.

FIG. 14 is an SEM photograph showing an exemplary cross-section of the first substrate after the fourth step in the process of producing the liquid crystal display device of Comparative Example 1. FIG. 15 is an SEM photograph showing an exemplary cross-section of the first substrate after the fifth step in the process of producing the liquid crystal display device of Comparative Example 1. As shown in FIG. 14, in the fourth step, the development forms a hollow in an end of the bulk (a portion not a surface layer) of the resin black matrix layer 130B. A possible reason for this is that since the resin black matrix layer 130B is black, UV light reaches only the surface layer of the resin black matrix layer 130B in the UV light exposure in the third step, leading to the insolubilization reaction (insolubilization in developer) only on the surface layer.

Another possible reason why the development forms a hollow in an end of the bulk of the resin black matrix layer 130B in the fourth step is considered as follows. In a general color filter substrate, the glass substrate and the resin black matrix layer are in close contact with each other, while in the present comparative example, the aluminum layer used as the metal layer 120 and the resin black matrix layer 130B were in close contact with each other. The adhesion between the metal layer (e.g., aluminum layer) and the resin black matrix layer is stronger than the adhesion between the glass substrate and the resin black matrix layer. Thus, when the development time was not sufficient in the present comparative example in which the metal layer 120 and the resin black matrix layer 130B were in close contact with each other, residues of the resin black matrix layer 130B might be left even in the regions where UV light had not been applied. For such a problem, in the present comparative example, the developing time of the resin black matrix layer 130B needed to be longer than the developing time in the usual process of producing color filter substrates. Thus, the development formed a hollow in the end of the bulk of the resin black matrix layer 130B in the fourth step.

In other words, since the development of the resin black matrix layer 130B on the metal layer 120 (specifically, an aluminum layer) needs a longer time than the development of the resin black matrix layer on the glass substrate, and the bulk of the resin black matrix layer 130B is not easily reacted by UV light, a hollow is formed in the end of the bulk of the patterned resin black matrix layer 130B with the surface layer being left. When the resin black matrix layer 130B having such a shape is baked in the fifth step, it is deformed by heat. Finally, as shown in FIG. 15, the surface layer portion (thin film region 130B1) having a small thickness at the end of the patterned resin black matrix layer 130B is in close contact with the surface of the metal layer 120 (specifically, the surface of the aluminum layer).

Figure 16:
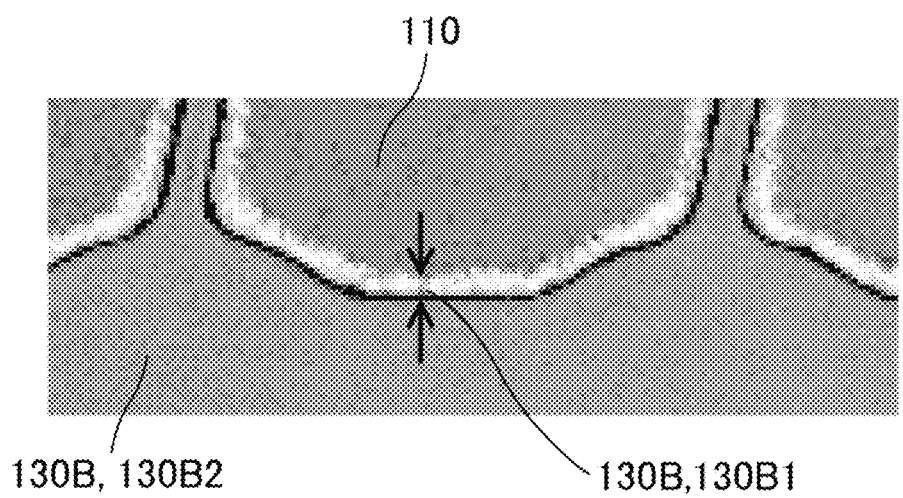
FIG. 16 is a photograph showing an exemplary result of observation, using an optical microscope, of reflection at a flat surface of the first substrate after the sixth step in the process of producing the liquid crystal display device of Comparative Example 1.

FIG. 16 is a photograph showing an exemplary result of observation, using an optical microscope, of reflection at a flat surface of the first substrate after the sixth step in the process of producing the liquid crystal display device of Comparative Example 1. In FIG. 16, a region 130B2 having a sufficient film thickness in the resin black matrix layer 130B has a sufficient optical density (OD) value, while the small thickness end of the patterned resin black matrix layer 130B (thin film region 130B1) has an insufficient OD value. In this case, the reflection at the metal layer 120 causes an increase in external light reflection in the panel, deteriorating the visibility in bright light. The end of the patterned metal layer 120 is not smooth and has an intricate shape. Such an intricate portion scatters light from the backlight, disrupting the polarization state of the light and thus causing light leakage in the black display.

Production of Liquid Crystal Display Device of Example 1-1

Figure 17:
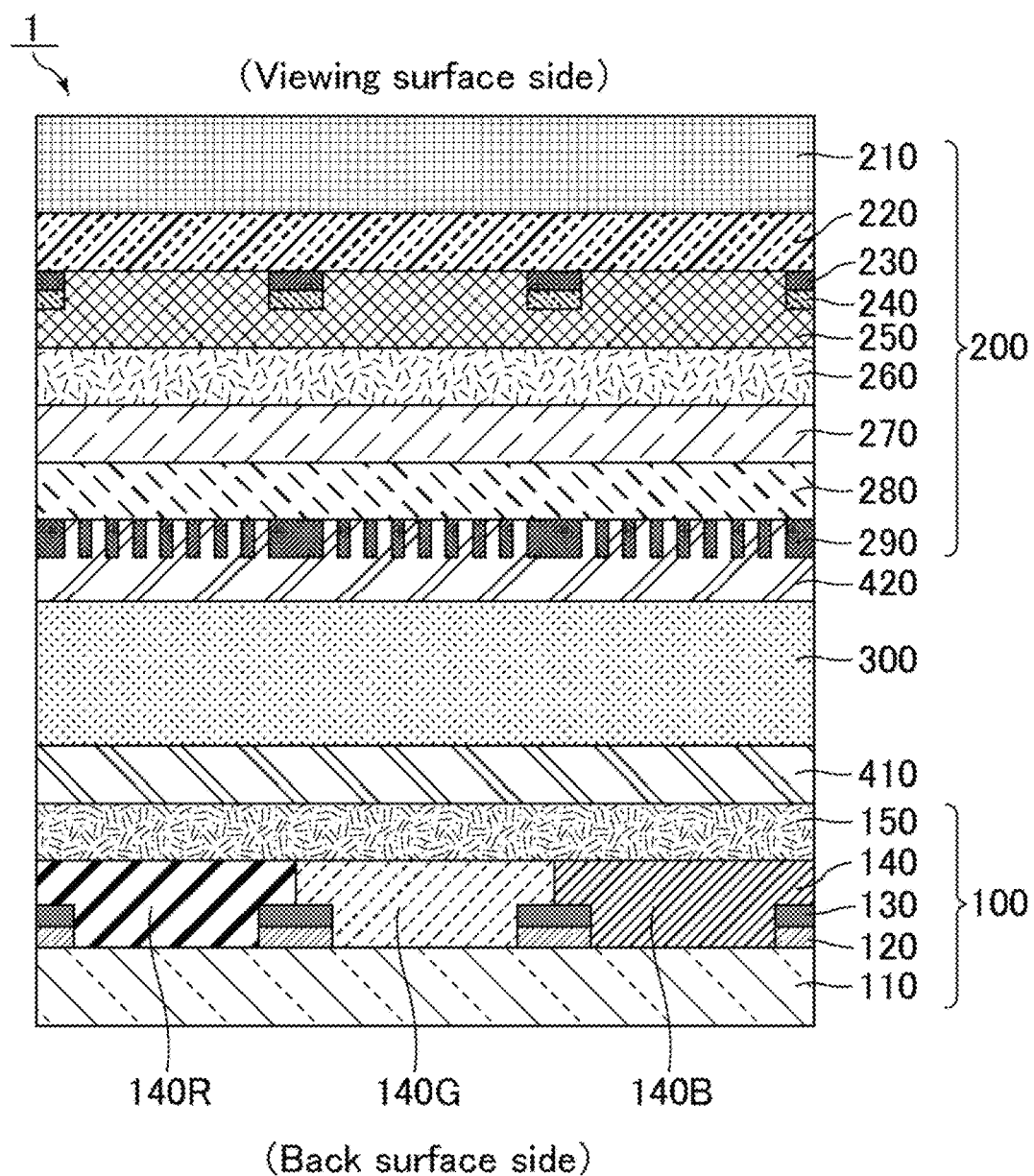
FIG. 17 is a schematic cross-sectional view of a liquid crystal display device of Example 1-1.

FIG. 17 is a schematic cross-sectional view of a liquid crystal display device of Example 1-1. The liquid crystal display device 1 of Example 1-1 shown in FIG. 17, which corresponds to the liquid crystal display device of Embodiment 1, is a liquid crystal display device having an inverted structure. The first substrate 100 in the liquid crystal display device 1 of Example 1-1 was produced by patterning an aluminum layer as the metal layer 120 using the resist layer 130 to leave the resist layer 130 as a permanent film. The resist layer 130 is usually removed after the patterning. The liquid crystal display device 1 of Example 1-1 was specifically produced as follows.

Figure 18A:
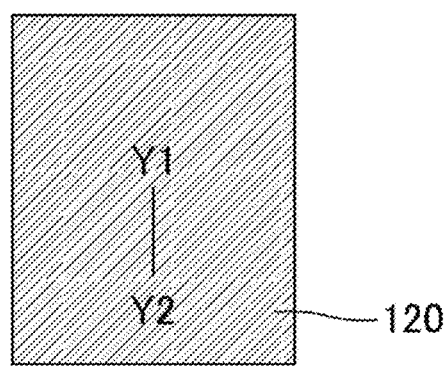
FIG. 18A is a schematic plan view showing a first step in a process of producing the liquid crystal display device of Example 1-1.
Figure 18B:
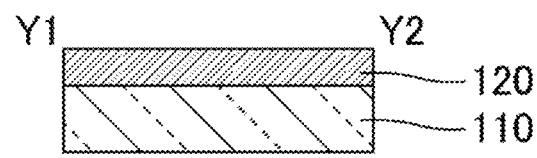
FIG. 18B is a schematic cross-sectional view showing the first step in the process of producing the liquid crystal display device of Example 1-1.

First, the first substrate 100 in the liquid crystal display device 1 of Example 1-1 was produced as follows. FIG. 18A is a schematic plan view showing a first step in a process of producing the liquid crystal display device of Example 1-1. FIG. 18B is a schematic cross-sectional view showing the first step in the process of producing the liquid crystal display device of Example 1-1. FIG. 18B is a schematic cross-sectional view taken along line Y1-Y2 in FIG. 18A. First, in the first step, as shown in FIGS. 18A and 18B, aluminum was vapor-deposited to a thickness of 200 nm on the entire surface of a glass substrate as the first supporting substrate 110, whereby an aluminum layer was formed as the metal layer 120.

Figure 19A:
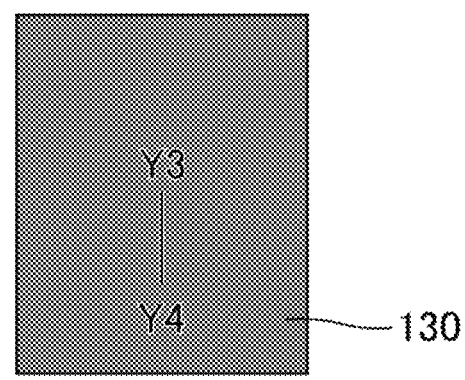
FIG. 19A is a schematic plan view showing a second step in the process of producing the liquid crystal display device of Example 1-1.
Figure 19B:
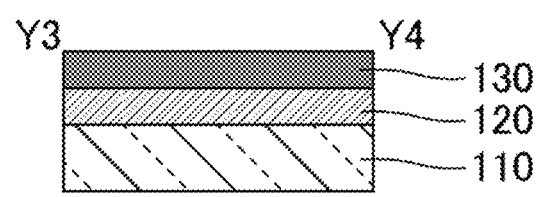
FIG. 19B is a schematic cross-sectional view showing the second step in the process of producing the liquid crystal display device of Example 1-1.

FIG. 19A is a schematic plan view showing a second step in the process of producing the liquid crystal display device of Example 1-1. FIG. 19B is a schematic cross-sectional view showing the second step in the process of producing the liquid crystal display device of Example 1-1. FIG. 19B is a schematic cross-sectional view taken along line Y3-Y4 in FIG. 19A. Next, in the second step (the application step), as shown in FIGS. 19A and 19B, a novolac positive resist material was applied to the metal layer 120 with a slit coater so as to have a dry film thickness of 1.6 µm after pre-baking. After the application, the novolac positive resist material was pre-baked (the solvent was dried) at 70° C. for 90 seconds.

Figure 20A:
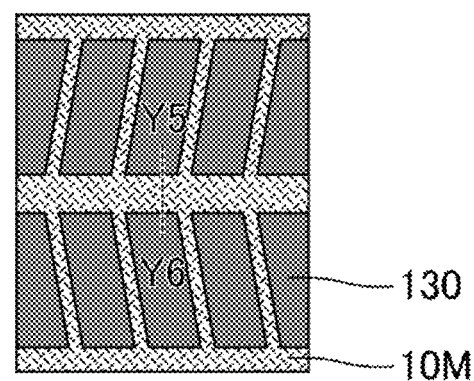
FIG. 20A is a schematic plan view showing a third step in the process of producing the liquid crystal display device of Example 1-1.
Figure 20B:
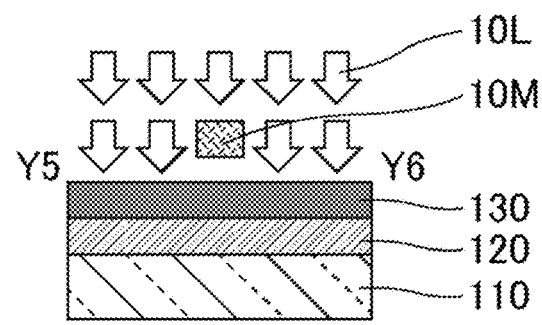
FIG. 20B is a schematic cross-sectional view showing the third step in the process of producing the liquid crystal display device of Example 1-1.

FIG. 20A is a schematic plan view showing a third step in the process of producing the liquid crystal display device of Example 1-1. FIG. 20B is a schematic cross-sectional view showing the third step in the process of producing the liquid crystal display device of Example 1-1. FIG. 20B is a schematic cross-sectional view taken along line Y5-Y6 in FIG. 20A. Next, in the third step (the exposure step), as shown in FIGS. 20A and 20B, the novolac positive resist material was exposed to the UV light 10L through the photomask 10M disposed in a predetermined pattern. The UV light 10L was a mixture of g-line, h-line, and i-line, and the irradiation amount was 25 mJ/cm$^2$.

Figure 21A:
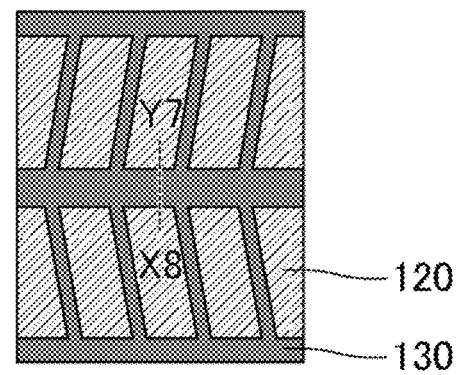
FIG. 21A is a schematic plan view showing a fourth step in the process of producing the liquid crystal display device of Example 1-1.
Figure 21B:
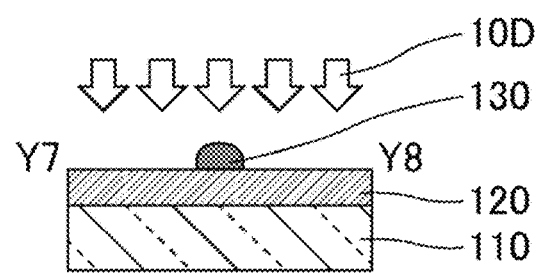
FIG. 21B is a schematic cross-sectional view showing the fourth step in the process of producing the liquid crystal display device of Example 1-1.

FIG. 21A is a schematic plan view showing a fourth step in the process of producing the liquid crystal display device of Example 1-1. FIG. 21B is a schematic cross-sectional view showing the fourth step in the process of producing the liquid crystal display device of Example 1-1. FIG. 21B is a schematic cross-sectional view taken along line Y7-Y8 in FIG. 21A. Next, in the fourth step (the development step), as shown in FIGS. 21A and 21B, the exposed novolac positive resist material was developed using the developer 10D, whereby the resist layer 130 was formed. The developing time was 80 seconds. The developer 10D was an alkaline aqueous solution (0.045% by weight aqueous potassium hydroxide solution). The aqueous potassium hydroxide solution which adhered to the substrate during the development was rinsed with pure water. The fourth step left the resist layer 130 only in the regions where UV light had not been applied.

Figure 22A:
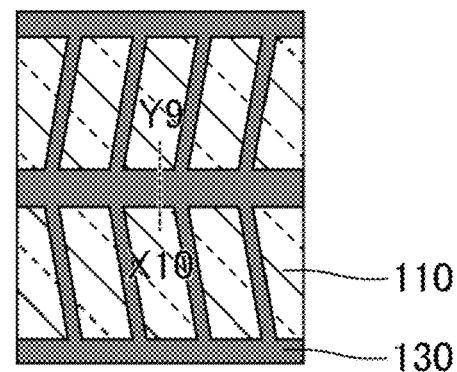
FIG. 22A is a schematic plan view showing a fifth step in the process of producing the liquid crystal display device of Example 1-1.
Figure 22B:
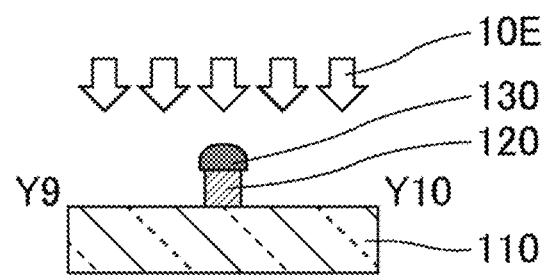
FIG. 22B is a schematic cross-sectional view showing the fifth step in the process of producing the liquid crystal display device of Example 1-1.

FIG. 22A is a schematic plan view showing a fifth step in the process of producing the liquid crystal display device of Example 1-1. FIG. 22B is a schematic cross-sectional view showing the fifth step in the process of producing the liquid crystal display device of Example 1-1. FIG. 22B is a schematic cross-sectional view taken along line Y9-Y10 in FIG. 22A. Next, in the fifth step (the etching step), as shown in FIGS. 22A and 22B, the metal layer 120 was etched through the resist layer 130 using the etchant 10E. The etching time was 80 seconds. The etchant 10E was an acid mixture containing phosphoric acid, acetic acid, and nitric acid. The acid mixture which adhered to the substrate during the etching was rinsed with pure water. In the fifth step, the metal layer 120 was etched only in the regions where no resist layer 130 was disposed, whereby the metal layer 120 having almost the same pattern as the resist layer 130 was formed.

Figure 23A:
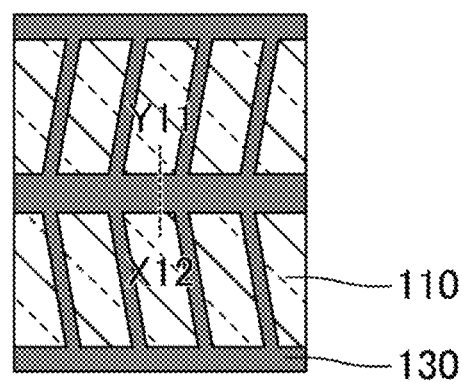
FIG. 23A is a schematic plan view showing a sixth step in the process of producing the liquid crystal display device of Example 1-1.
Figure 23B:
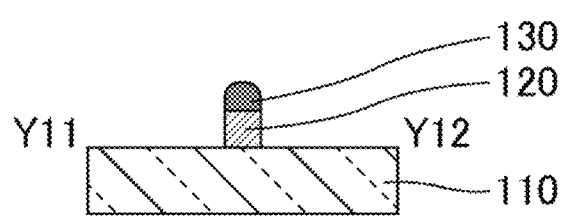
FIG. 23B is a schematic cross-sectional view showing the sixth step in the process of producing the liquid crystal display device of Example 1-1.

FIG. 23A is a schematic plan view showing a sixth step in the process of producing the liquid crystal display device of Example 1-1. FIG. 23B is a schematic cross-sectional view showing the sixth step in the process of producing the liquid crystal display device of Example 1-1. FIG. 23B is a schematic cross-sectional view taken along line Y11-Y12 in FIG. 23A. Next, in the sixth step (the heating step), as shown in FIGS. 23A and 23B, the resist layer 130 was heated (baked) at 230° C. for 30 minutes, whereby the patterned resist layer 130 was thermally cured to be stabilized as a permanent film.

Figure 24A:
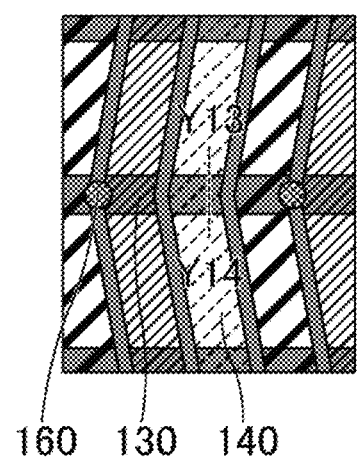
FIG. 24A is a schematic plan view showing a seventh step in the process of producing the liquid crystal display device of Example 1-1.
Figure 24B:
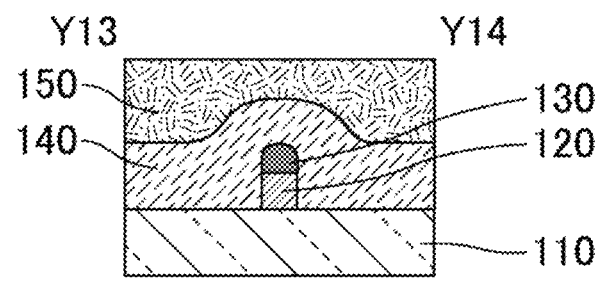
FIG. 24B is a schematic cross-sectional view showing the seventh step in the process of producing the liquid crystal display device of Example 1-1.

FIG. 24A is a schematic plan view showing a seventh step in the process of producing the liquid crystal display device of Example 1-1. FIG. 24B is a schematic cross-sectional view showing the seventh step in the process of producing the liquid crystal display device of Example 1-1. FIG. 24B is a schematic cross-sectional view taken along line Y13-Y14 in FIG. 24A. Next, in the seventh step (the CF layer-forming step), as shown in FIGS. 24A and 24B, the CF layer 140, the overcoat layer 150, and the photospacers 160 were formed by photolithography as in the usual process of producing color filters. Thus, the first substrate 100 in the liquid crystal display device 1 of Example 1-1 having an inverted structure was produced. The width of the metal layer 120 was the same as the width of the resist layer 130. The metal layer 120 was superimposed with the resist layer 130.

Next, the second substrate 200 in the liquid crystal display device 1 of Example 1-1 was produced as in the production of the second substrate 200 in the liquid crystal display device 1R of Comparative Example 1.

An alignment film material was applied to the surface of the first substrate 100 on a side opposite to the glass substrate in Example 1-1 and the surface of the second substrate 200 on a side opposite to the glass substrate in Example 1-1, whereby the first alignment film 410 and the second alignment film 420 were formed, respectively.

Furthermore, a sealing material was applied to the second substrate 200, the liquid crystal layer 300 was formed in the region surrounded by the sealing material, and the first substrate 100 and the second substrate 200 were attached to each other with the sealing material, whereby the liquid crystal display device 1 of Example 1-1 was produced. The liquid crystal layer 300 contained negative liquid crystals and had a Δn of 0.1 and a cell gap of 3.2 μm.

Production of Liquid Crystal Display Device of Example 1-2

A liquid crystal display device 1 of Example 1-2 was produced as in Example 1-1, except that in the fifth step in the process of producing the liquid crystal display device of Example 1-1, the metal layer 120 was etched for 120 seconds using the etchant 10E.

Evaluation of Liquid Crystal Display Devices of Examples 1-1 and 1-2

Figure 25:
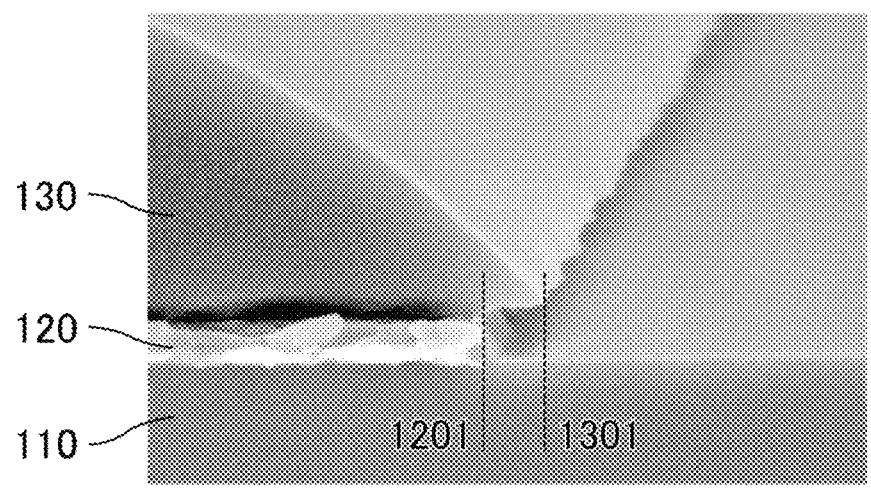
FIG. 25 is an SEM photograph showing an exemplary cross-section of a first substrate after the fifth step in the process of producing the liquid crystal display device of Example 1-1.
Figure 26:
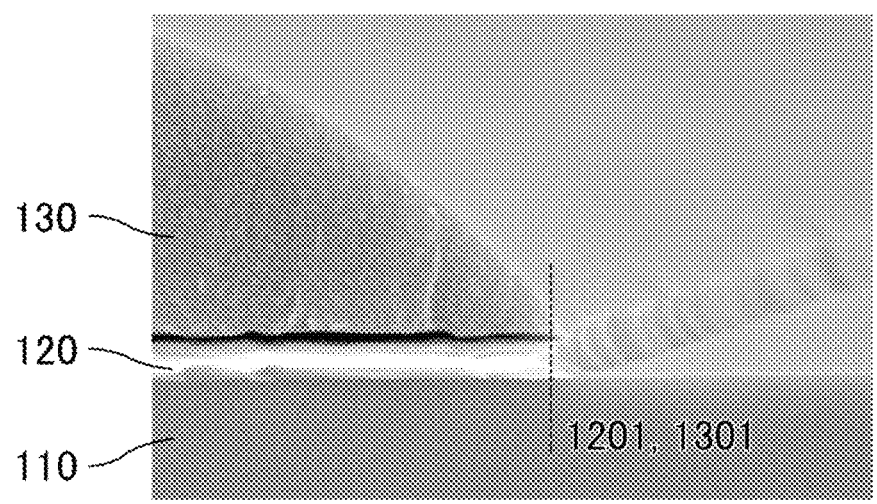
FIG. 26 is an SEM photograph showing an exemplary cross-section of the first substrate after the sixth step in the process of producing the liquid crystal display device of Example 1-1.

FIG. 25 is an SEM photograph showing an exemplary cross-section of the first substrate after the fifth step in the process of producing the liquid crystal display device of Example 1-1. FIG. 26 is an SEM photograph showing an exemplary cross-section of the first substrate after the sixth step in the process of producing the liquid crystal display device of Example 1-1. As shown in FIG. 25, in Example 1-1, unlike in Comparative Example 1, no sharp reduction in the resist film thickness was observed at an end of the resist pattern, and an ideal tapered shape was obtained. Furthermore, in FIG. 25, the end 1201 of the metal layer 120 and the end 1301 of the resist layer 130 were about 0.15 μm apart, while in FIG. 26 showing the cross-section of the first substrate after the sixth step, these ends coincided with each other. This is presumably because baking at a high temperature equal to or higher than the glass transition temperature (in the present example, at 200° C., which is the glass transition temperature of the resist layer 130 including a novolac positive resist material) promotes gelation of the resist layer 130 during the baking, and the surface tension on the metal layer 120 allows the end 1301 of the resist layer 130 and the end 1201 of the metal layer 120 to naturally coincide with each other.

Figure 27:
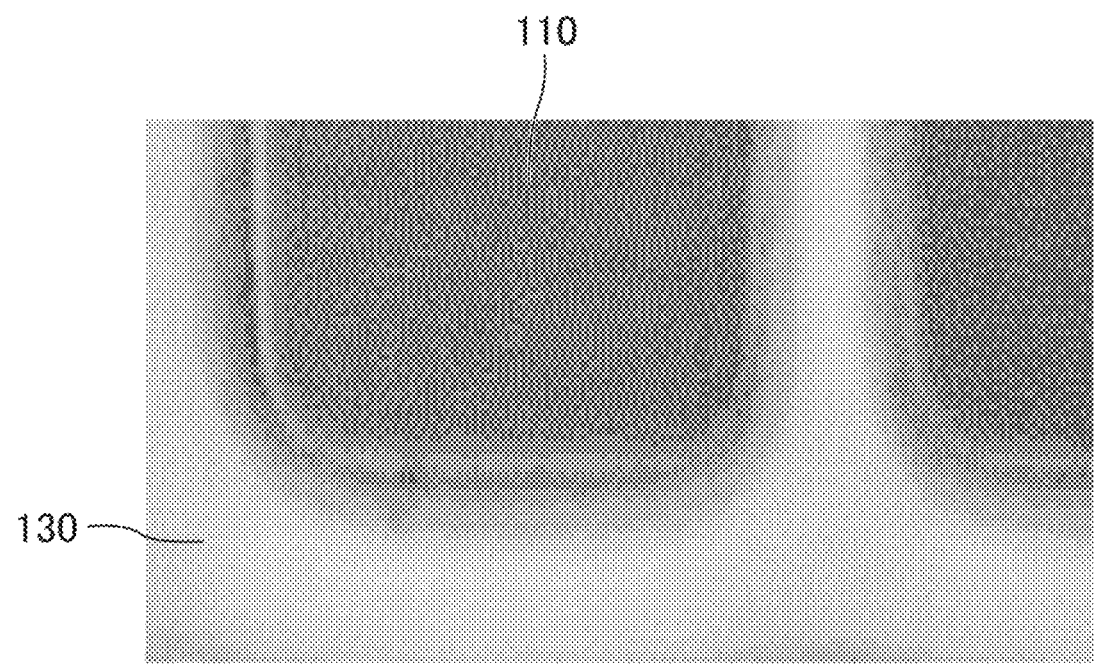
FIG. 27 is a photograph showing an exemplary result of observation, using an optical microscope, of reflection at a flat surface of the first substrate after the sixth step in the process of producing the liquid crystal display device of Example 1-1.

FIG. 27 is a photograph showing an exemplary result of observation, using an optical microscope, of reflection at a flat surface of the first substrate after the sixth step in the process of producing the liquid crystal display device of Example 1-1. As shown in FIG. 27, in Example 1-1, unlike in Comparative Example 1, no region was present where external light reflection caused by the metal layer 120 appeared. In Example 1-1, unlike in Comparative Example 1, no sharp reduction in the resist film thickness was observed at an end of the resist pattern, and an ideal tapered shape was obtained, whereby external light reflection in the panel caused by the metal layer 120 was reduced. Furthermore, unlike in Comparative Example 1, the shape of the end of the pattern in Example 1-1 was not intricate and was a smooth straight line. This can prevent light leakage at the end of the pattern in black display and prevent deterioration of the contrast ratio of the panel.

Also in Example 1-2, unlike in Comparative Example 1, no region was present where external light reflection caused by the metal layer 120 appeared as in Example 1-1. In Example 1-2, unlike in Comparative Example 1, no sharp reduction in the resist film thickness was observed at an end of the resist pattern, and an ideal tapered shape was obtained as in Example 1-1, whereby external light reflection in the panel caused by the metal layer 120 was reduced. Furthermore, unlike in Comparative Example 1, the shape of the end of the pattern in Example 1-2 was not intricate and was a smooth straight line as in Example 1-1. This can prevent light leakage at the end of the pattern in black display and prevent deterioration of the contrast ratio of the panel.

Examples 1-1 and 1-2 demonstrate that even if the end of the patterned metal layer 120 does not coincide with the end of the patterned resist layer 130 immediately after etching the aluminum layer, the subsequent high-temperature baking (e.g., baking at 200° C. or higher) promotes gelation of the resist layer 130 during the baking, and the surface tension on the metal layer 120 allows the end of the patterned resist layer 130 and the end of the patterned metal layer 120 to coincide with each other.

Figure 28:
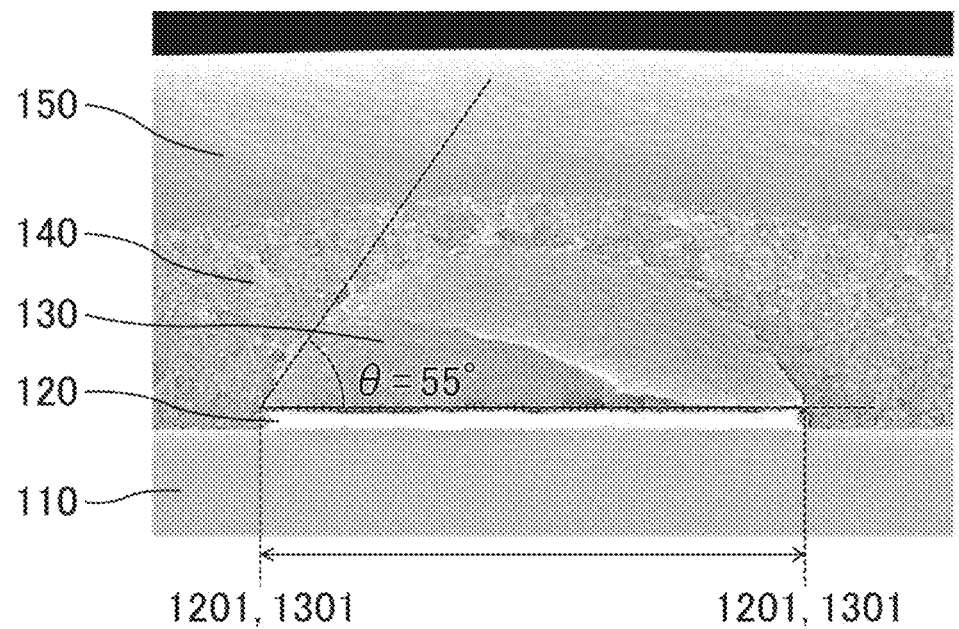
FIG. 28 is an SEM photograph showing an exemplary cross-section of the first substrate after the seventh step in the process of producing the liquid crystal display device of Example 1-1.
Figure 29:
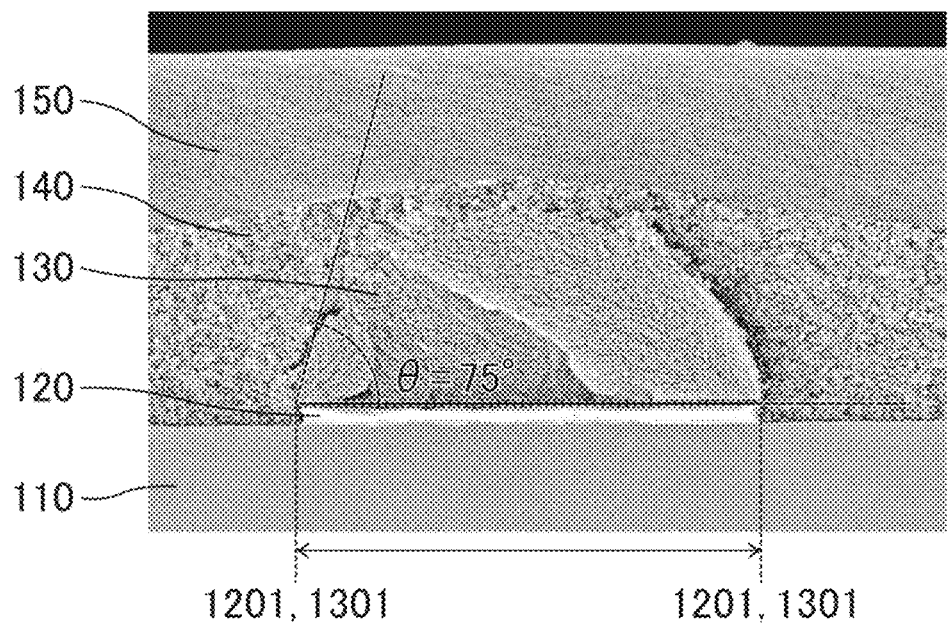
FIG. 29 is an SEM photograph showing an exemplary cross-section of a first substrate after a seventh step in a process of producing a liquid crystal display device of Example 1-2.

FIG. 28 is an SEM photograph showing an exemplary cross-section of the first substrate after the seventh step in the process of producing the liquid crystal display device of Example 1-1. FIG. 29 is an SEM photograph showing an exemplary cross-section of a first substrate after a seventh step in a process of producing a liquid crystal display device of Example 1-2. As shown in FIGS. 28 and 29, also in Example 1-2, the end 1201 of the metal layer 120 and the end 1301 of the resist layer 130 coincide with each other as in Example 1-1. The taper angle θ of the end 1301 of the resist layer 130 in Example 1-1 was 55°, and the taper angle θ of the end 1301 of the resist layer 130 in Example 1-2 was 75°. The resist layer 130 in Example 1-2 in which the etching time in the fifth step was longer more expanded in the thickness direction than the resist layer 130 in Example 1-1 in which the etching time was shorter.

The reason for this is considered as follows. When the etching time in the fifth step in the production process in each of Examples 1-1 and 1-2 increases, the width of the metal layer 120 decreases. Here, the resist layer 130 in the second step in the production process in Example 1-1 and the resist layer 130 in the second step in the production process in Example 1-2 have the same thickness. Thus, both in the case of the etching time of 80 seconds (Example 1-1) and the case of the etching time of 120 seconds (Example 1-2) in the fifth step, the resist layer 130 in Example 1-1 and the resist layer 130 in Example 1-2 have the same thickness, i.e., they have the same volume, before the baking in the sixth step. The volume of each resist layer 130 is kept constant before and after the baking in the sixth step. Thus, the resist layer 130 in Example 1-2 in which the etching time in the fifth step is longer (the width of the metal layer 120 is smaller) is considered to more expand in the thickness direction than the resist layer 130 in Example 1-1 in which the etching time in the fifth step is shorter (the width of the metal layer 120 is larger).

Here, when the taper angle θ of the end 1301 of the resist layer 130 is larger, the thickness of the end of the patterned resist layer 130 is larger, and the phenomenon that the reflection at the metal layer 120 is seen through the end of the patterned resist layer 130 can be prevented. Also in the liquid crystal display device 1 of Example 1-1 in which the etching time was 80 seconds, the reflection at the metal layer 120 was not seen through. It was found that increasing the etching time enabled obtaining a wider process margin.

Production of Liquid Crystal Display Devices of Examples 2-1 and 2-2

A liquid crystal display device 1 of Example 2-1 was produced as in Example 1-1, except that in the second step in the process of producing the liquid crystal display device, a novolac positive resist material was applied so as to have a dry film thickness of 1.3 A liquid crystal display device 1 of Example 2-2 was produced as in Example 1-1, except that in the second step in the process of producing the liquid crystal display device, a novolac positive resist material was applied so as to have a dry film thickness of 1.3 μm and in the fifth step therein the metal layer 120 was etched for 120 seconds using the etchant 10E.

Evaluation of Liquid Crystal Display Devices of Examples 2-1 and 2-2

Figure 30:
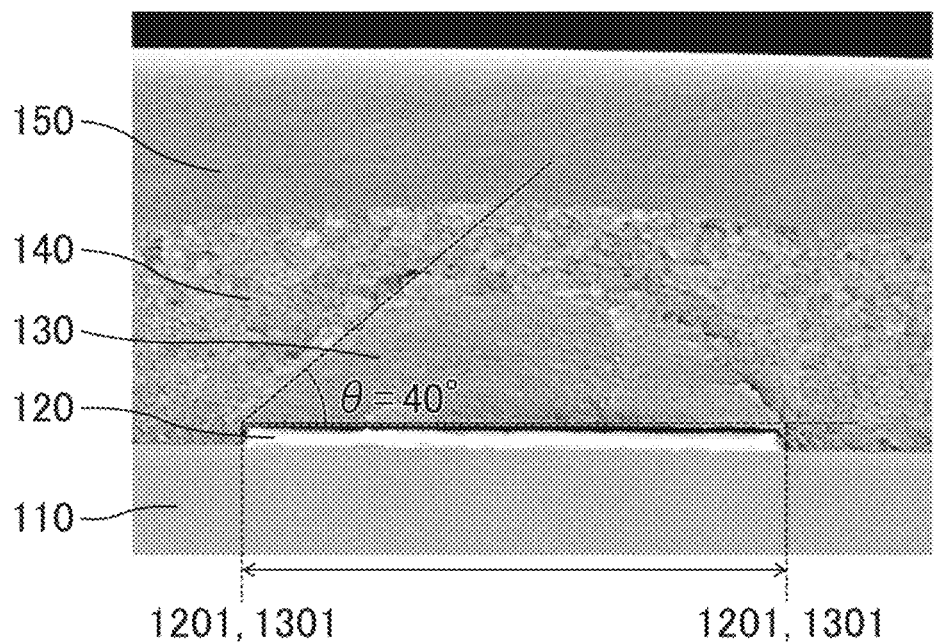
FIG. 30 is an SEM photograph showing an exemplary cross-section of a first substrate after a seventh step in a process of producing a liquid crystal display device of Example 2-1.
Figure 31:
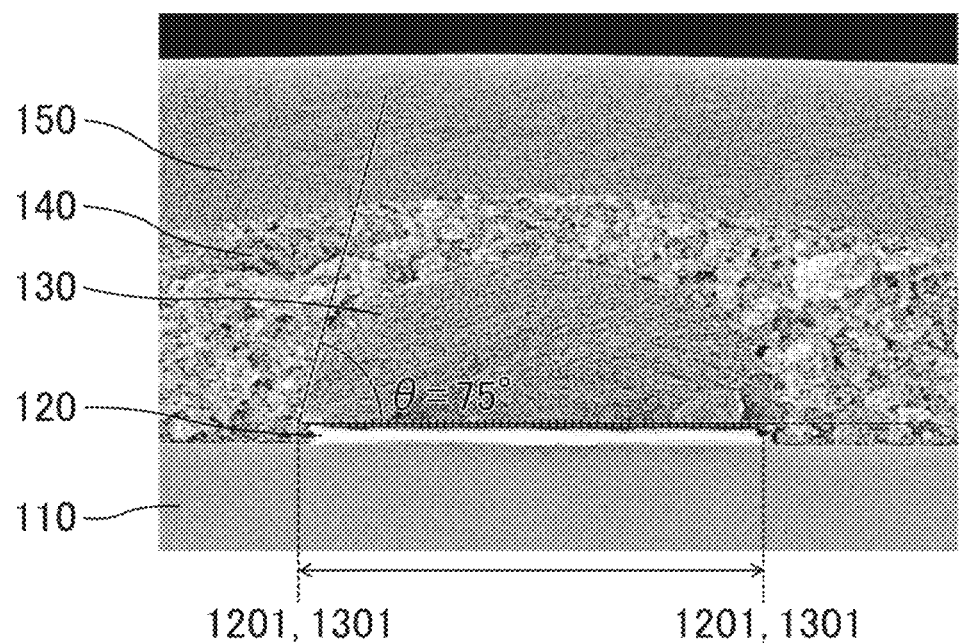
FIG. 31 is an SEM photograph showing an exemplary cross-section of a first substrate after a seventh step in a process of producing a liquid crystal display device of Example 2-2.

FIG. 30 is an SEM photograph showing an exemplary cross-section of a first substrate after a seventh step in a process of producing a liquid crystal display device of Example 2-1. FIG. 31 is an SEM photograph showing an exemplary cross-section of a first substrate after a seventh step in a process of producing a liquid crystal display device of Example 2-2. As shown in FIGS. 30 and 31, also in Examples 2-1 and 2-2, the end 1201 of the metal layer 120 and the end 1301 of the resist layer 130 coincide with each other as in Example 1-1.

Furthermore, also in Examples 2-1 and 2-2, unlike in Comparative Example 1, no region was present where external light reflection caused by the metal layer 120 appeared as in Example 1-1. In Examples 2-1 and 2-2, unlike in Comparative Example 1, no sharp reduction in the resist film thickness was observed at an end of the resist pattern, and an ideal tapered shape was obtained as in Example 1-1, whereby external light reflection in the panel caused by the metal layer 120 was reduced. Furthermore, unlike in Comparative Example 1, the shape of the end of the pattern in each of Examples 2-1 and 2-2 was not intricate and was a smooth straight line as in Example 1-1. This can prevent light leakage at the end of the pattern in black display and prevent deterioration of the contrast ratio of the panel.

As shown in FIG. 30, the taper angle θ of the end 1301 of the resist layer 130 in Example 2-1 in which the etching time was 80 seconds was 40°. As shown in FIG. 31, the taper angle θ of the end 1301 of the resist layer 130 in Example 2-2 in which the etching time was 120 seconds was 75°. As in Examples 1-1 and 1-2, the resist layer 130 in Example 2-2 in which the etching time in the fifth step was longer more expanded in the thickness direction than the resist layer 130 in Example 2-1 in which the etching time in the fifth step was shorter.

Further, the whole of the first substrate 100 in each of Examples 2-1 and 2-2 was observed with an optical microscope to confirm that the reflection at the metal layer 120 was not seen through at the end of the patterned resist layer 130 in both Examples 2-1 and 2-2.

Production of Liquid Crystal Display Device of Example 3

Figure 32:
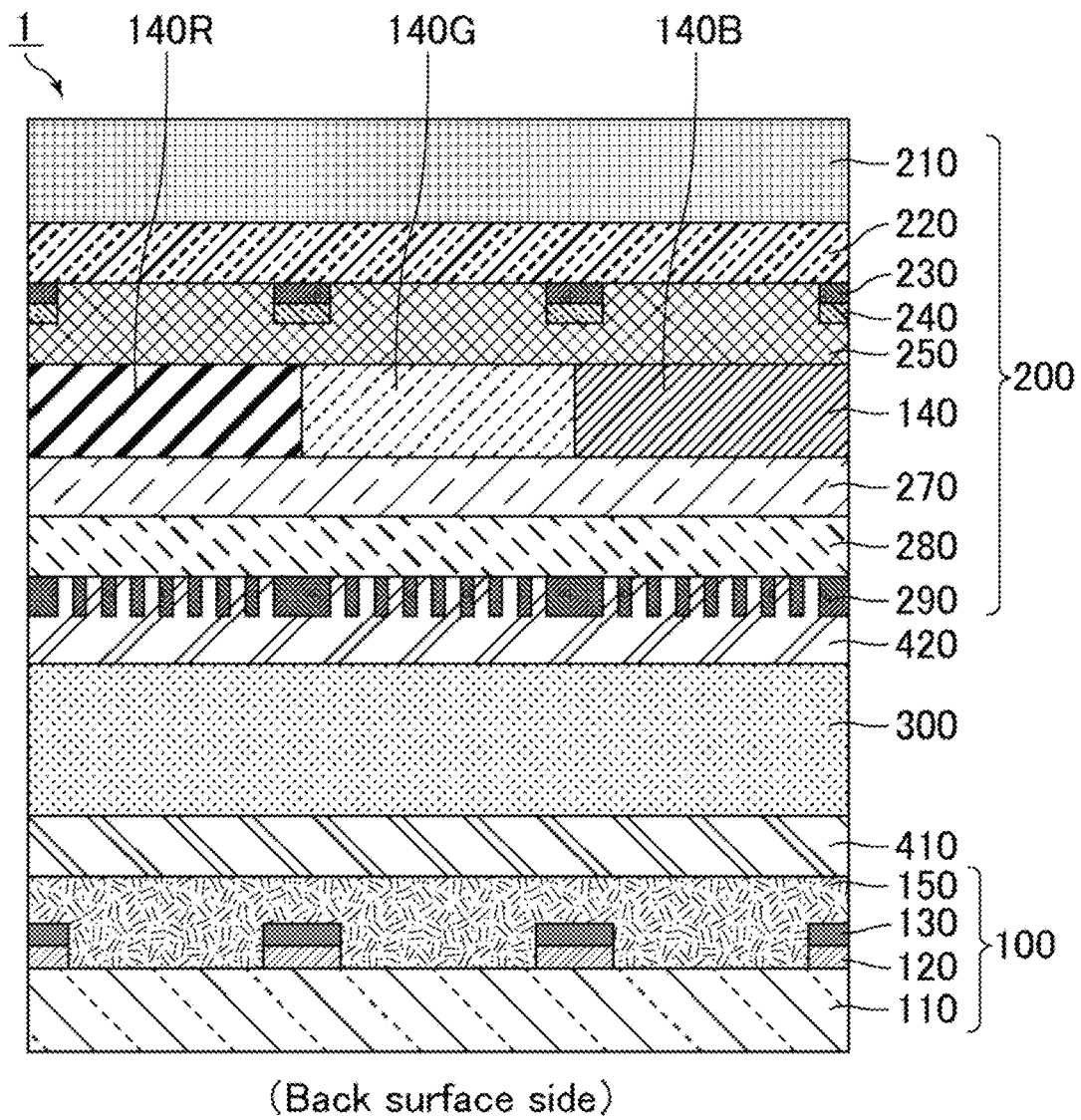
FIG. 32 is a schematic cross-sectional view of a liquid crystal display device of Example 3.

FIG. 32 is a schematic cross-sectional view of a liquid crystal display device of Example 3. A liquid crystal display device 1 of Example 3 shown in FIG. 32 was produced as in Example 1-1, except that the CF layer 140 was not disposed in the first substrate 100, and the CF layer 140 was disposed in the second substrate 200 instead of the organic flattening film 260. The liquid crystal display device 1 of Example 3 was specifically produced as follows.

Figure 33A:
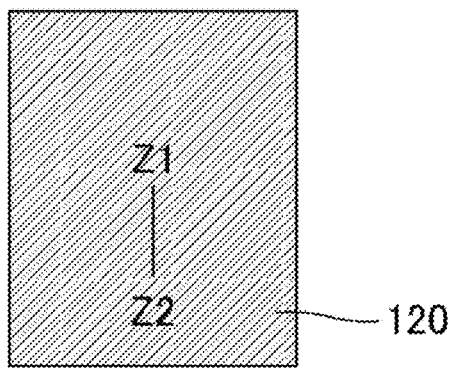
FIG. 33A is a schematic plan view showing a first step in a process of producing the liquid crystal display device of Example 3.
Figure 33B:
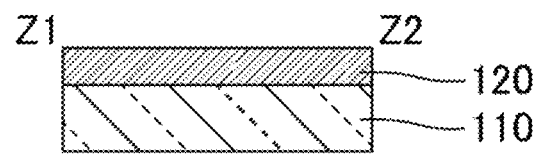
FIG. 33B is a schematic cross-sectional view showing the first step in the process of producing the liquid crystal display device of Example 3.

First, the first substrate 100 in the liquid crystal display device 1 of Example 3 was produced as follows. FIG. 33A is a schematic plan view showing a first step in a process of producing the liquid crystal display device of Example 3. FIG. 33B is a schematic cross-sectional view showing the first step in the process of producing the liquid crystal display device of Example 3. FIG. 33B is a schematic cross-sectional view taken along line Z1-Z2 in FIG. 33A. First, in the first step, as shown in FIGS. 33A and 33B, an aluminum layer was formed as the metal layer 120 on the first supporting substrate 110 as in the first step in Example 1-1.

Figure 34A:
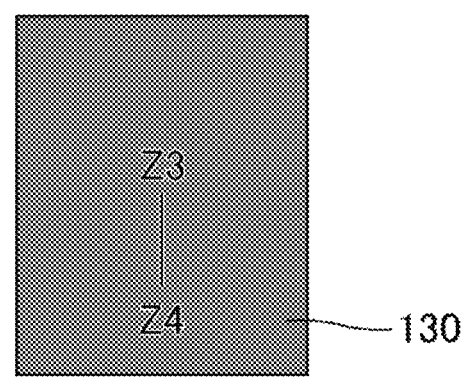
FIG. 34A is a schematic plan view showing a second step in the process of producing the liquid crystal display device of Example 3.
Figure 34B:
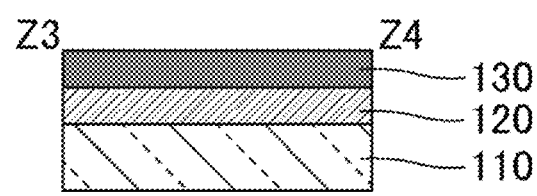
FIG. 34B is a schematic cross-sectional view showing the second step in the process of producing the liquid crystal display device of Example 3.

FIG. 34A is a schematic plan view showing a second step in the process of producing the liquid crystal display device of Example 3. FIG. 34B is a schematic cross-sectional view showing the second step in the process of producing the liquid crystal display device of Example 3. FIG. 34B is a schematic cross-sectional view taken along line Z3-Z4 in FIG. 34A. Next, in the second step, as shown in FIGS. 34A and 34B, a novolac positive resist material was applied to the metal layer 120 as in the second step in Example 1-1.

Figure 35A:
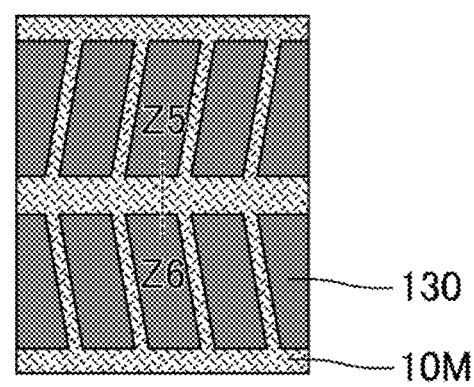
FIG. 35A is a schematic plan view showing a third step in the process of producing the liquid crystal display device of Example 3.
Figure 35B:
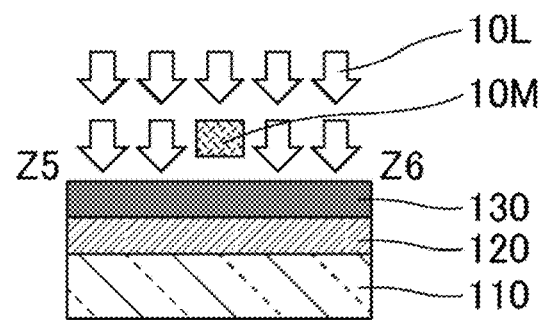
FIG. 35B is a schematic cross-sectional view showing the third step in the process of producing the liquid crystal display device of Example 3.

FIG. 35A is a schematic plan view showing a third step in the process of producing the liquid crystal display device of Example 3. FIG. 35B is a schematic cross-sectional view showing the third step in the process of producing the liquid crystal display device of Example 3. FIG. 35B is a schematic cross-sectional view taken along line Z5-Z6 in FIG. 35A. Next, in the third step, as shown in FIGS. 35A and 35B, the novolac positive resist material was exposed to the UV light 10L through the photomask 10M as in the third step in Example 1-1.

Figure 36A:
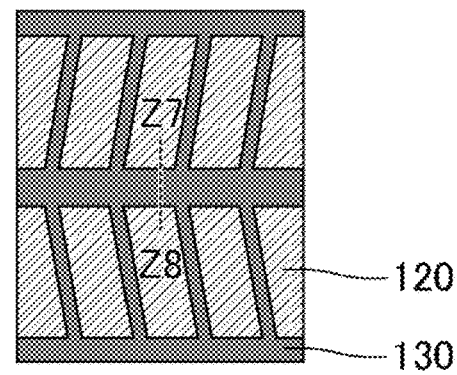
FIG. 36A is a schematic plan view showing a fourth step in the process of producing the liquid crystal display device of Example 3.
Figure 36B:
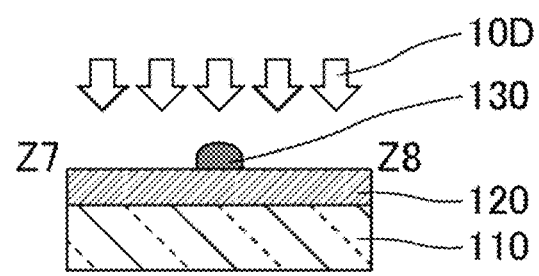
FIG. 36B is a schematic cross-sectional view showing the fourth step in the process of producing the liquid crystal display device of Example 3.

FIG. 36A is a schematic plan view showing a fourth step in the process of producing the liquid crystal display device of Example 3. FIG. 36B is a schematic cross-sectional view showing the fourth step in the process of producing the liquid crystal display device of Example 3. FIG. 36B is a schematic cross-sectional view taken along line Z7-Z8 in FIG. 36A. Next, in the fourth step, as shown in FIGS. 36A and 36B, the exposed novolac positive resist material was developed using the developer 10D as in the fourth step in Example 1-1, whereby the resist layer 130 was formed.

Figure 37A:
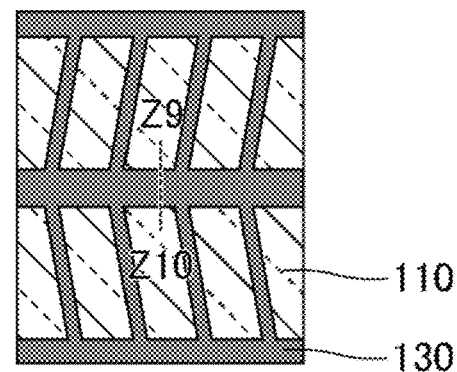
FIG. 37A is a schematic plan view showing a fifth step in the process of producing the liquid crystal display device of Example 3.
Figure 37B:
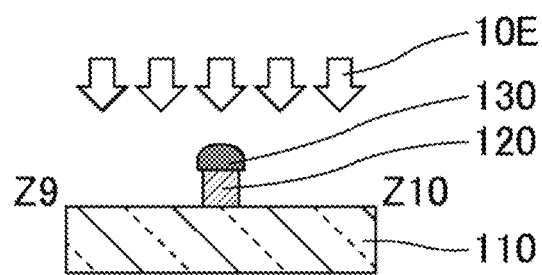
FIG. 37B is a schematic cross-sectional view showing the fifth step in the process of producing the liquid crystal display device of Example 3.

FIG. 37A is a schematic plan view showing a fifth step in the process of producing the liquid crystal display device of Example 3. FIG. 37B is a schematic cross-sectional view showing the fifth step in the process of producing the liquid crystal display device of Example 3. FIG. 37B is a schematic cross-sectional view taken along line Z9-Z10 in FIG. 37A. Next, in the fifth step, as shown in FIGS. 37A and 37B, the metal layer 120 was etched through the resist layer 130 using the etchant 10E as in the fifth step in Example 1-1.

Figure 38A:
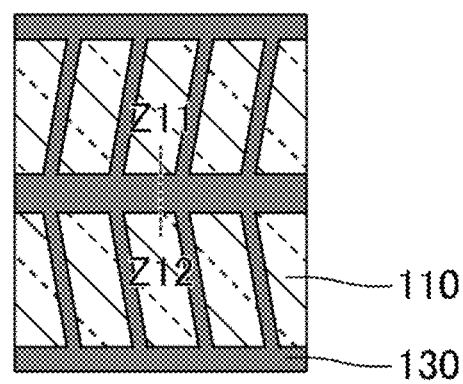
FIG. 38A is a schematic plan view showing a sixth step in the process of producing the liquid crystal display device of Example 3.
Figure 38B:
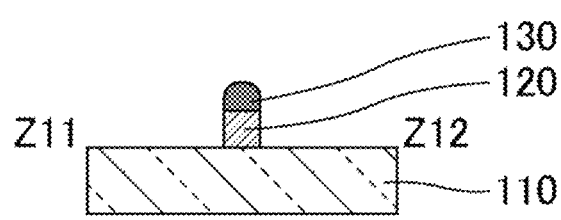
FIG. 38B is a schematic cross-sectional view showing the sixth step in the process of producing the liquid crystal display device of Example 3.

FIG. 38A is a schematic plan view showing a sixth step in the process of producing the liquid crystal display device of Example 3. FIG. 38B is a schematic cross-sectional view showing the sixth step in the process of producing the liquid crystal display device of Example 3. FIG. 38B is a schematic cross-sectional view taken along line Z11-Z12 in FIG. 38A. Next, in the sixth step, as shown in FIGS. 38A and 38B, the resist layer 130 was heated at 230° C. for 30 minutes, whereby the patterned resist layer 130 was thermally cured to be stabilized as a permanent film, as in the sixth step in Example 1-1.

Figure 39A:
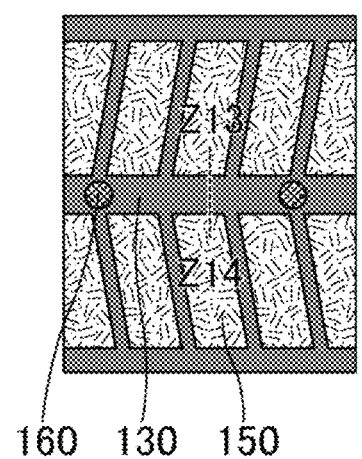
FIG. 39A is a schematic plan view showing a seventh step in the process of producing the liquid crystal display device of Example 3.
Figure 39B:
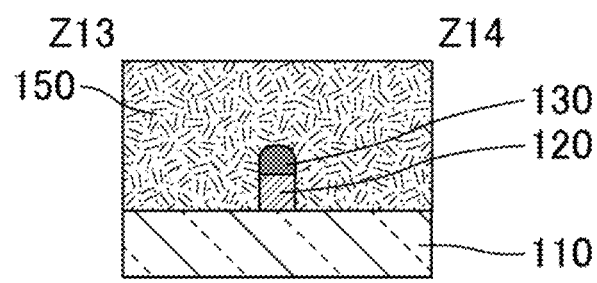
FIG. 39B is a schematic cross-sectional view showing the seventh step in the process of producing the liquid crystal display device of Example 3.

FIG. 39A is a schematic plan view showing a seventh step in the process of producing the liquid crystal display device of Example 3. FIG. 39B is a schematic cross-sectional view showing the seventh step in the process of producing the liquid crystal display device of Example 3. FIG. 39B is a schematic cross-sectional view taken along line Z13-Z14 in FIG. 39A. Next, in the seventh step, as shown in FIGS. 39A and 39B, the overcoat layer 150 and the photospacers 160 were formed by photolithography, whereby the first substrate 100 in the liquid crystal display device 1 of Example 3 having an inverted structure was produced.

Next, a second substrate 200 in Example 3 was produced as in the production of the second substrate 200 in Example 1-1, except that the CF layer 140 was disposed instead of the organic flattening film 260.

The liquid crystal display device 1 of Example 3 was produced as in Example 1-1 using the first substrate 100 and the second substrate 200 in Example 3 produced as described above.

Evaluation of Liquid Crystal Display Device of Example 3

Also in the liquid crystal display device 1 of Example 3, the end 1201 of the metal layer 120 and the end 1301 of the resist layer 130 coincided with each other as in Example 1-1.

Furthermore, also in Example 3, unlike in Comparative Example 1, no region was present where external light reflection caused by the metal layer 120 appeared as in Example 1-1. In Example 3, unlike in Comparative Example 1, no sharp reduction in the resist film thickness was observed at an end of the resist pattern, and an ideal tapered shape was obtained as in Example 1-1, whereby external light reflection in the panel caused by the metal layer 120 was reduced. Furthermore, unlike in Comparative Example 1, the shape of the end of the pattern in Example 3 was not intricate and was a smooth straight line as in Example 1-1. This can prevent light leakage at the end of the pattern in black display and prevent deterioration of the contrast ratio of the panel.

In Example 3, the CF layer 140 in the second substrate 200 absorbed light, whereby the phenomenon was prevented that the external light was diffracted by the common electrodes 290 (ITO electrodes provided with slits) and looked like rainbow colors on the panel.

Optical Properties of Resist Layers in Examples 1-1, 1-2, 2-1, 2-2, and 3

Figure 40:
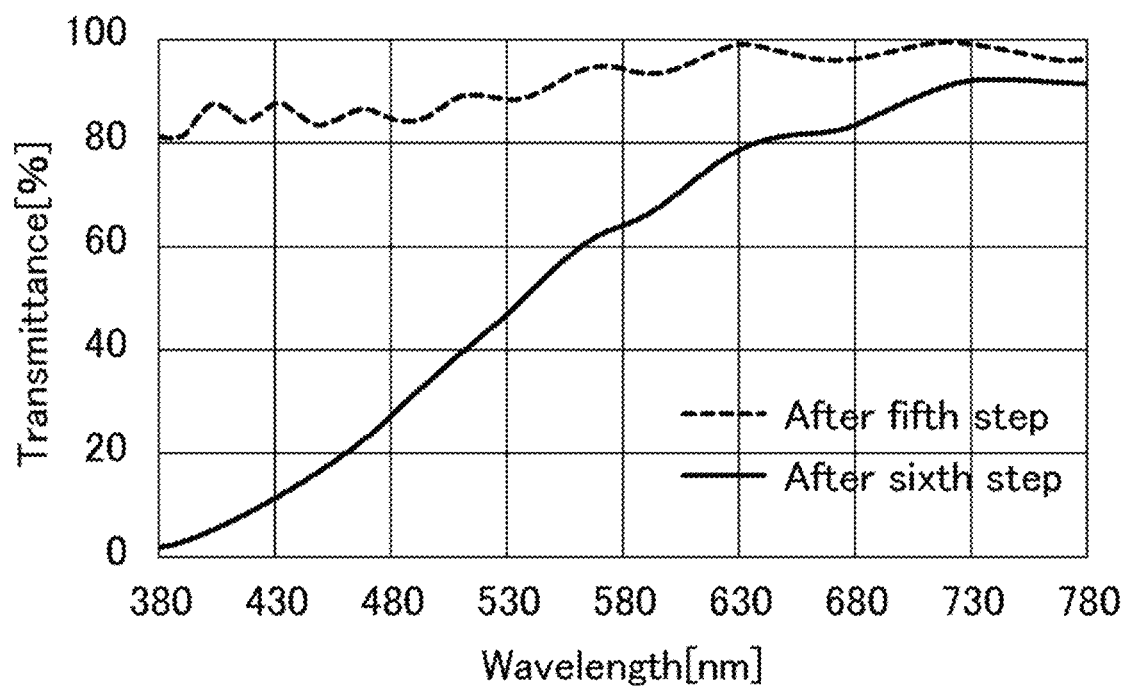
FIG. 40 is a graph of transmittance spectra of resist layers in Examples 1-1, 1-2, 2-1, 2-2, and 3.

FIG. 40 is a graph of transmittance spectra of resist layers in Examples 1-1, 1-2, 2-1, 2-2, and 3. FIG. 40 shows the transmittance spectra (wavelength dependency of transmittance) of a single film having a film thickness of 1.6 μm of the resist layer 130 used in each of Examples 1-1, 1-2, 2-1, 2-2, and 3. FIG. 40 illustrates the transmittance spectrum of the resist layer 130 after the fifth step in the production process of each example and the transmittance spectrum of the resist layer 130 after the sixth step in the production process of each example.

As shown in FIG. 40, the resist layer 130 used in each of Examples 1-1, 1-2, 2-1, 2-2, and 3 baked at a temperature equal to or higher than the glass transition temperature (200° C. or higher) had a remarkably reduced transmittance in the blue to green wavelength range. Owing to such a feature, the reflectance of external light can be reduced when the panel is viewed from the viewer's side, and good visibility of the display can be kept in bright light.

Production of Liquid Crystal Display Device of Example 4

A liquid crystal display device 1 of Example 4 was produced as in Example 1-1, except that the following points were changed. In Example 4, the second step was performed as in the production process in Example 1-1, except that the resist layer 130 was formed using an acrylic positive resist material (trade name: JAS, available from JSR Corporation) instead of the novolac positive resist material and was pre-baked at 90° C. for 120 seconds. Further, in Example 4, the fourth step was performed as in the production process in Example 1-1, except that the development was performed using a 0.5% by weight aqueous tetramethylammonium hydroxide solution as the developer 10D instead of the 0.045% by weight aqueous potassium hydroxide solution. Furthermore, in Example 4, the sixth step was performed as in the production process in Example 1-1, except that the baking was performed at 220° C. for 60 minutes.

Evaluation of Liquid Crystal Display Device of Example 4

The liquid crystal display device 1 of Example 4 was also observed as in Example 1-1. Also in Example 4, unlike in Comparative Example 1, no region was present where external light reflection caused by the metal layer 120 appeared as in Example 1-1. In Example 4, unlike in Comparative Example 1, no sharp reduction in the resist film thickness was observed at an end of the resist pattern, and an ideal tapered shape was obtained as in Example 1-1, whereby external light reflection in the panel caused by the metal layer 120 was reduced. Furthermore, unlike in Comparative Example 1, the shape of the end of the pattern in Example 4 was not intricate and was a smooth straight line as in Example 1-1. This can prevent light leakage at the end of the pattern in black display and prevent deterioration of the contrast ratio of the panel.

REFERENCE SIGNS LIST

1, 1R: liquid crystal display device
1P: sub-pixel
1PA: optical opening
10: liquid crystal panel
10D: developer
10E: etchant
10L: UV light
10M: photomask
11: first polarizing plate
12: second polarizing plate
20: backlight
21: light source
22: light guide plate
23: reflector
100, 100R: first substrate
110: first supporting substrate
120: metal layer
130: resist layer
130B: black matrix (BM) layer
130B1: thin film region
130B2: region with sufficient film thickness
140: color filter (CF) layer
140B: blue color filter
140G: green color filter
140R: red color filter
150: overcoat layer
160: photospacer
200: second substrate
210: second supporting substrate
220: gate insulating film
230: reflectance-reducing layer
240: metal line layer
240D: drain electrode layer
240G: gate electrode layer
240S: source electrode layer
240T: thin-film transistor (TFT)
240X: semiconductor layer
250: first interlayer insulating film
260: organic flattening film
270: pixel electrode
280: second interlayer insulating film
290: common electrode
300: liquid crystal layer
410: first alignment film
420: second alignment film
1201, 1301: end

What is claimed is:

1. A liquid crystal display device sequentially comprising, from a back surface side toward a viewing surface side: a first substrate; a liquid crystal layer; and a second substrate,
the liquid crystal display device comprising sub-pixels each including an optical opening allowing light to pass through,
the first substrate sequentially including, from the back surface side toward the viewing surface side: a supporting substrate; a metal layer surrounding the optical openings; and a resist layer being superimposed with the metal layer and being in contact with the metal layer,
an end of the resist layer being superimposed with an end of the metal layer and having a taper angle θ of 40° or more.

2. The liquid crystal display device according to claim 1, wherein a distance between the end of the resist layer and the end of the metal layer is within 0.1 μm.

3. The liquid crystal display device according to claim 1, wherein the resist layer is a positive resist layer.

4. The liquid crystal display device according to claim 1, wherein the resist layer includes at least one of novolac resin or acrylic resin.

5. The liquid crystal display device according to claim 1, wherein the resist layer is formed from a resist material plastically deforming when heated at 200° C. or higher and having a lower transmittance in the visible wavelength range after the heating than before the heating.

6. The liquid crystal display device according to claim 1, further comprising
a backlight on or behind a back surface side of the first substrate.

7. The liquid crystal display device according to claim 1, wherein the second substrate includes a thin-film transistor and a metal line layer.

8. The liquid crystal display device according to claim 7, wherein the second substrate further includes a reflectance-reducing layer on a viewing surface side of the metal line layer, the reflectance-reducing layer being superimposed with the metal line layer.

9. The liquid crystal display device according to claim 1, wherein the first substrate further includes a color filter layer.

10. The liquid crystal display device according to claim 1, wherein the second substrate further includes a color filter layer.

* * * * *